United States Patent
Furukawa et al.

(10) Patent No.: US 7,560,735 B2
(45) Date of Patent: Jul. 14, 2009

(54) SEMICONDUCTOR ELEMENT, ORGANIC TRANSISTOR, LIGHT-EMITTING DEVICE, AND ELECTRONIC DEVICE

(75) Inventors: Shinobu Furukawa, Kanagawa (JP); Ryota Imahayashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 266 days.

(21) Appl. No.: 11/379,014

(22) Filed: Apr. 17, 2006

(65) Prior Publication Data

US 2006/0237731 A1    Oct. 26, 2006

(30) Foreign Application Priority Data

Apr. 22, 2005    (JP)    ............... 2005-125807

(51) Int. Cl.
*H01L 31/12* (2006.01)
(52) U.S. Cl. ............... 257/72; 257/40; 257/103; 257/E21.259; 257/E21.5
(58) Field of Classification Search ............ 257/40, 257/72, 83, 84, 103
See application file for complete search history.

(56) References Cited

U.S. PATENT DOCUMENTS

2003/0218166 A1* 11/2003 Tsutsui .................. 257/40
2006/0238112 A1* 10/2006 Kasama et al. ........... 313/504
2006/0273303 A1* 12/2006 Wu et al. .................. 257/40

OTHER PUBLICATIONS

Y.-Y. Lin et al.; "Stacked Pentacene Layer Organic Thin-Film Transistors with Improved Characteristics"; *IEEE Electron Device Letters*, vol. 18, No. 12; pp. 606-608; Dec. 1997.

Marcus Ahles et al.; "Light emission from a polymer transistor"; *Applied Physics Letters*, vol. 84, No. 3; pp. 428-430; Jan. 19, 2004.

Tomo Sakanoue et al.; "Preparation of Organic Light-emitting Field-effect Transistors with Asymmetric Electrodes"; *Chemistry Letters*, vol. 34, No. 4; pp. 494-495; 2005.

* cited by examiner

*Primary Examiner*—A. Sefer
(74) *Attorney, Agent, or Firm*—Fish & Richardson P.C.

(57) ABSTRACT

It is an object of the present invention to provide an organic transistor having a low drive voltage. It is also another object of the present invention to provide an organic transistor, in which light emission can be obtained, which can be manufactured simply and easily. According to an organic light-emitting transistor, a composite layer containing an organic compound having a hole-transporting property and a metal oxide is used as part of the electrode that injects holes among source and drain electrodes, and a composite layer containing an organic compound having an electron-transporting property and an alkaline metal or an alkaline earth metal is used as part of the electrode that injects electrons, where either composite layer has a structure of being in contact with an organic semiconductor layer.

16 Claims, 16 Drawing Sheets

SEMICONDUCTOR ELEMENT, ORGANIC TRANSISTOR, LIGHT-EMITTING DEVICE, AND ELECTRONIC DEVICE

BACKGROUND OF THE INVENTION

1. Field of the Invention

The present invention relates to a semiconductor element that can be used as a switching element or an amplifier element (for example, an organic transistor). In addition, the present invention relates to a light-emitting device with the use thereof.

2. Description of the Related Art

It has been promoted to develop a light-emitting element where electrons are injected from one electrode and holes are injected from the other electrode into a stacked body containing an organic compound sandwiched between the pair of electrodes to recombine the electrons and holes in the stacked body so that a light-emitting material in the stacked body is excited and thus light emission can be obtained.

Being a self-light-emitting type, the light-emitting element is superior in visibility with low dependence on a viewing angle and a thin shape and weight saving can be realized easily. Therefore, attention is focused on the use of a flat panel display of the next generation. In addition, it is also possible to manufacture an element in a flexible film such as plastic, the usage of which is expected as a mobile display.

A light-emitting device using this light-emitting element can be roughly divided into two types, that is, a passive matrix type and an active matrix type. In the active matrix light-emitting device, a transistor is electrically connected in each pixel to control light emission of a light-emitting element.

Thus far, an inorganic semiconductor material typified by silicon has been used for a transistor of the active matrix light-emitting device. However, it is necessary to process at high temperature in order to form the inorganic semiconductor material typified by silicon as a semiconductor layer; therefore, it is difficult to use a flexible material such as plastic or a film for a substrate.

On the other hand, a transistor in which an organic semiconductor material is used as a semiconductor layer can be formed even at comparatively low temperature; therefore, it is possible to manufacture in principle a transistor not only over a glass substrate but also over a substrate having low heat resistance such as plastic.

In such a manner, as an example of a field effect transistor in which the organic semiconductor material is used as a semiconductor layer (hereinafter, referred to as an "organic transistor"), a transistor in which silicon dioxide ($SiO_2$) is used as a gate insulating layer and pentacene is used as a semiconductor layer (see the following Reference 1: Y. Y. Lin, D. J. Gundlach, S. F. Nelson, T. N. Jackson, IEEE Electron Device Letters, Vol. 18, pp. 606-608 (1997)) can be given. In this report, it is reported that field effect mobility is 1 $cm^2$/Vs and transistor performance comparable to amorphous silicon can be obtained even when the organic semiconductor material is used as a semiconductor layer.

An active matrix light-emitting device in which a light-emitting element is driven using this organic transistor is also proposed. Further, there are several reports regarding an organic transistor in which holes are injected from a source electrode and electrons are injected from a drain electrode into an organic semiconductor layer thereof to recombine the holes and electrons in the semiconductor layer and thus light emission is obtained from the organic semiconductor layer itself (hereinafter, referred to as an organic light-emitting transistor) (see Reference 2: M. Ahles, A. Hepp, R. Schmechel, F. v. Seggern, APPLIED PHYSICS LETTERS, Vol. 84, No. 3, pp. 428-430 (2004) and Reference 3: T. Sakanoue, E. Fujiwara, R. Yamada, H. Tada, Chemistry Letters, Vol. 34, No. 4, pp. 494-495 (2005), for example).

Since these organic light-emitting transistors are elements having both functions of a transistor and a light-emitting element, it is considered that the organic light-emitting transistors are advantageous in an aperture ratio compared with a case of manufacturing a transistor, which drives a light-emitting element, separately from a light-emitting element. In addition, since a manufacturing element is reduced compared with the case of manufacturing both a transistor and a light-emitting element, it is considered that the organic light-emitting transistors are advantageous also in a yield or a manufacturing cost of a product.

In the meantime, in the organic light-emitting transistor, holes and electrons have to be injected into a semiconductor layer from a source electrode and a drain electrode in order to obtain light emission; however, there are such problems that light emission does not occur well, a transistor characteristic such as carrier mobility is decreased, or a drive voltage is increased when there is an energy barrier in the interface.

The energy barrier in injecting holes and electrons into a semiconductor layer depends on a relation between a material used for electrodes and an organic semiconductor material and largely influences a work function of the material used for electrodes. Therefore, an electrode material that allows holes and electrons to be injected into a semiconductor layer efficiently, and that can reduce a drive voltage has an extremely narrow option.

Further, in forming a metal electrode, there is a case where the work function may be changed due to etching in forming the electrode or a case where the lower layer may be deteriorated; thus, it is not easy to obtain an organic light-emitting transistor having a low drive voltage which can be manufactured simply and easily.

SUMMARY OF THE INVENTION

Thus, it is an object of the present invention to provide a semiconductor element having a low drive voltage. In addition, it is another object of the present invention to provide a semiconductor element, in which light emission can be obtained and the light emission can be controlled by itself, which can be manufactured simply and easily.

In addition, it is another object of the present invention to provide an organic transistor having a low drive voltage. It is also another object of the present invention to provide an organic transistor, in which light emission can be obtained and the light emission can be controlled by changing voltage of a gate electrode, which can be manufactured simply and easily.

Moreover, it is another object of the present invention to provide a light-emitting device having a high aperture ratio and yield. Further, it is another object of the present invention to provide a light-emitting device that can be manufactured more simply and easily. Furthermore, it is the other object of the present invention to provide a light-emitting device having a low drive voltage and power consumption.

The present inventors reached the conclusion on the basis of their keen examination that the above problems can be solved by an organic light-emitting transistor in which a composite layer containing an organic compound having a hole-transporting property and a metal oxide is used as part of an electrode that injects holes among source and drain electrodes and a composite layer containing an organic compound having an electron-transporting property and an alkaline metal or an alkaline earth metal is used as part of the electrode that injects electrons, where either composite layer has a structure of being in contact with an organic semiconductor layer.

According to one feature of the present invention, a semiconductor element includes a first electrode; a semiconductor layer containing an organic compound; an insulating film which electrically insulates the first electrode and the semiconductor layer; a second electrode which injects electrons into the semiconductor layer; and a third electrode which injects holes into the semiconductor layer, wherein the third electrode has at least partially a layer made of a first composite material containing an organic compound having a hole-transporting property and a metal oxide, wherein the second electrode has at least partially a layer made of a second composite material containing an organic compound having an electron-transporting property and alkaline metal or alkaline earth metal, and wherein the layer made of the first composite material and the layer made of the second composite material are each in contact with the semiconductor layer.

In the above structure of a semiconductor element according to the present invention, the second electrode is formed of two layers of the layer made of the first composite material and a conductive layer. When the conductive layer is not in contact with the semiconductor layer, the length of a channel length direction of the conductive layer may be shorter than the length of a channel length direction of the layer made of the first composite material. In addition, the conductive layer may be covered with the layer made of the first composite material. When the conductive layer is in contact with the semiconductor layer, the conductive layer may be covered with the layer made of the first composite material.

In the above structure of a semiconductor element according to the present invention, the third electrode is formed of two layers of the layer made of the second composite material and a conductive layer. When the conductive layer is not in contact with the semiconductor layer, the length of a channel length direction of the conductive layer may be shorter than the length of a channel length direction of the layer made of the second composite material. In addition, the conductive layer may be covered with the layer made of the second composite material. When the conductive layer is in contact with the semiconductor layer, the conductive layer may be covered with the layer made of the second composite material.

In the above structure of a semiconductor element according to the present invention, the second electrode further has the layer made of the second composite material, and the layer made of the first composite material and the layer made of the second composite material are at least partially in contact with each other. In addition, the second electrode is formed of three layers of the layer made of the first composite material, the layer made of the second composite material, and a conductive layer.

In the above structure of a semiconductor element according to the present invention, the third electrode further has the layer made of the first composite material, and the layer made of the first composite material and the layer made of the second composite material are at least partially in contact with each other. In addition, the third electrode is formed of three layers of the layer made of the first composite material, the layer made of the second composite material, and a conductive layer.

According to one feature of the present invention, an organic transistor includes a gate electrode; a semiconductor layer containing an organic compound; an insulating film which electrically insulates the gate electrode and the semiconductor layer; a source electrode; and a drain electrode, wherein the source electrode has at least partially a layer made of a first composite material containing an organic compound having a hole-transporting property and a metal oxide, wherein the drain electrode has at least partially a layer made of a second composite material containing an organic compound having an electron-transporting property and alkaline metal or alkaline earth metal, and wherein the layer made of the first composite material and the layer made of the second composite material are each in contact with the semiconductor layer.

In the above structure of an organic transistor according to the present invention, the source electrode is formed of two layers of the layer made of the first composite material and a conductive layer. When the conductive layer is not in contact with the semiconductor layer, the length of a channel length direction of the conductive layer may be shorter than the length of a channel length direction of the layer made of the first composite material. In addition, the conductive layer may be covered with the layer made of the first composite material. When the conductive layer is in contact with the semiconductor layer, the conductive layer may be covered with the layer made of the first composite material.

In the above structure of an organic transistor according to the present invention, the drain electrode is formed of two layers of the layer made of the second composite material and a conductive layer. When the conductive layer is not in contact with the semiconductor layer, the length of a channel length direction of the conductive layer may be shorter than the length of a channel length direction of the layer made of the second composite material. In addition, the conductive layer may be covered with the layer made of the second composite material. When the conductive layer is in contact with the semiconductor layer, the conductive layer may be covered with the layer made of the second composite material.

In the above structure of an organic transistor according to the present invention, the source electrode further has the layer made of the second composite material, and the layer made of the first composite material and the layer made of the second composite material are at least partially in contact with each other. In addition, the source electrode is formed of three layers of the layer made of the first composite material, the layer made of the second composite material, and a conductive layer.

In the above structure of an organic transistor according to the present invention, the drain electrode further has the layer made of the first composite material, and the layer made of the first composite material and the layer made of the second composite material are at least partially in contact with each other. In addition, the drain electrode is formed of three layers of the layer made of the first composite material, the layer made of the second composite material, and a conductive layer.

According to another feature of the present invention, an organic transistor includes a gate electrode; a semiconductor layer containing an organic compound; an insulating film which electrically insulates the gate electrode and the semiconductor layer; a source electrode; and a drain electrode, wherein the source electrode has at least partially a layer made of a second composite material containing an organic compound having an electron-transporting property and alkaline metal or alkaline earth metal, wherein the drain electrode has at least partially a layer made of a first composite material containing an organic compound having a hole-transporting property and a metal oxide, and wherein the layer made of the first composite material and the layer made of the second composite material are each in contact with the semiconductor layer.

In the above structure of an organic transistor according to the present invention, the source electrode is formed of two layers of the layer made of the second composite material and a conductive layer. When the conductive layer is not in contact with the semiconductor layer, the length of a channel length direction of the conductive layer may be shorter than the length of a channel length direction of the layer made of the second composite material. In addition, the conductive layer may be covered with the layer made of the second composite material. When the conductive layer is in contact with the semiconductor layer, the conductive layer may be covered with the layer made of the second composite material.

In the above structure of an organic transistor according to the present invention, the drain electrode is formed of two layers of the layer made of the first composite material and a conductive layer. When the conductive layer is not in contact with the semiconductor layer, the length of a channel length direction of the conductive layer may be shorter than the length of a channel length direction of the layer made of the first composite material. In addition, the conductive layer may be covered with the layer made of the first composite material. When the conductive layer is in contact with the semiconductor layer, the conductive layer may be covered with the layer made of the first composite material.

In the above structure of an organic transistor according to the present invention, the source electrode further has the layer made of the first composite material, and the layer made of the first composite material and the layer made of the second composite material are at least partially in contact with each other. In addition, the source electrode is formed of three layers of the layer made of the first composite material, the layer made of the second composite material, and a conductive layer.

In the above structure of an organic transistor according to the present invention, the drain electrode further has the layer made of the second composite material, and the layer made of the first composite material and the layer made of the second composite material are at least partially in contact with each other. In addition, the drain electrode is formed of three layers of the layer made of the first composite material, the layer made of the second composite material, and a conductive layer.

In the above structure of an organic transistor according to the present invention, the semiconductor layer emits light when voltage is applied between the source electrode and the drain electrode, and emission luminance is changed by changing voltage applied to the gate electrode.

A semiconductor element according to the present invention has a low drive voltage. In addition, the semiconductor element according to the present invention, in which light emission can be obtained and the light emission can be controlled by the semiconductor element itself, can be manufactured simply and easily.

An organic transistor according to the present invention has a low drive voltage. In addition, the organic transistor according to the present invention, in which light emission can be obtained and the light emission can be controlled by changing voltage of a gate electrode, can be manufactured simply and easily.

Moreover, a light-emitting device according to the present invention has a high aperture ratio and high yields. Further, the light-emitting device according to the present invention can be manufactured simply and easily. Furthermore, the light-emitting device has a low drive voltage.

These and other objects, features and advantages of the present invention will become more apparent upon reading of the following detailed description along with the accompanied drawings.

DETAILED DESCRIPTION OF THE INVENTION

Embodiment Modes of the present invention will be explained below with reference to the accompanying drawings. However, it is to be easily understood that various changes and modifications will be apparent to those skilled in the art. Therefore, unless such changes and modifications depart from the scope of the invention, they should be construed as being included therein.

Embodiment Mode 1

A semiconductor element which is an embodiment mode of the present invention will be explained by giving drawings illustrated in FIGS. 1A to 1C, FIGS. 2A to 2C, FIGS. 3A to 3D, FIG. 4, FIGS. 5A to 5C, FIGS. 6A to 6C, FIGS. 7A to 7D, and FIGS. 8A to 8D as examples.

Figure 1A:
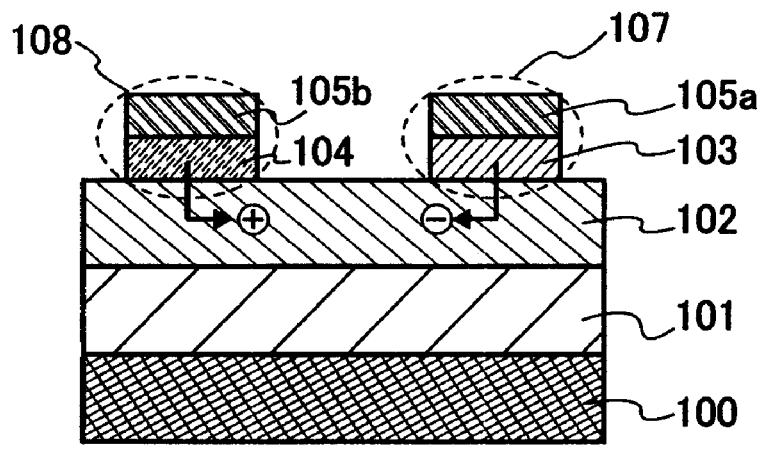
FIGS. 1A to 1C are each a schematic cross-sectional view of an organic light-emitting transistor according to the present invention.

A semiconductor element according to the present invention illustrated in FIG. 1A includes a first electrode 100, an insulating film 101, a semiconductor layer 102, a second electrode 107, and a third electrode 108.

The first electrode 100 is formed over an arbitrary insulator such as an insulating substrate or an insulating film which is not shown, and the insulating film 101 electrically insulates the semiconductor layer 102 and the first electrode 100. In addition, the second electrode 107 is formed of two layers of a conductive layer 105a and a layer 103 made of a second composite material and the third electrode 108 is formed of two layers of a conductive layer 105b and a layer 104 made of a first composite material, respectively. The layer 103 made of the second composite material in the second electrode 107 and the layer 104 made of the first composite material in the third electrode 108 are provided to be in contact with the semiconductor layer 102. The conductive layer 105a and the conductive layer 105b may not be in contact with the semiconductor layer 102.

Although not shown, among insulators where the first electrode 100 can be formed, as for a substrate, an insulating substrate such as a glass substrate; a quartz substrate; or a crystalline glass, a ceramic substrate, a stainless steel substrate, a metal substrate (such as tantalum, tungsten, or molybdenum), a semiconductor substrate, a plastic substrate (polyimide, acrylic, polyethylene terephthalate, polycarbonate, polyarylate, or polyethersulfone), or the like can be used. In addition, an insulating film formed from an inorganic insulating material such as silicon oxide, silicon nitride, silicon oxide containing nitrogen, and silicon nitride containing oxygen, an organic insulating material such as acrylic or polyimide, or a material composed of a skeleton structure formed by the bond of silicon and oxygen, in which an organic group at least containing hydrogen (such as an alkyl group or an aryl group), a fluoro group, or an organic group at least containing hydrogen and a fluoro group are included as a substituent, that is, a siloxane-based material may be formed over such a substrate. These insulating films may be formed by any of known methods such as a CVD method, a sputtering method, a vapor deposition method, and a wet method.

The materials of the first electrode 100, the conductive layer 105a, and the conductive layer 105b are not particularly limited, and the following materials can be given as examples: a metal such as platinum, gold, aluminum, chromium, nickel, cobalt, copper, titanium, magnesium, calcium, barium, natrium, or tungsten and an alloy containing these metals, a conductive high molecular compound such as polyaniline, polypyrrole, polythiophene, polyacetylene, or polydiacetylene, an inorganic semiconductor such as silicon, doped silicon, germanium, or gallium arsenic, and further a material in which acid (including Lewis acid), a halogen atom, a metal atom of an alkaline metal, an alkaline earth metal, or the like is doped. As for a conductive material used for source and drain electrodes, metal is generally used in many cases. These first electrode 100, conductive layer 105a, and conductive layer 105b may be formed by any of known methods such as a CVD method, a sputtering method, a vapor deposition method, and a wet method.

The material of the insulating film 101 is also not particularly limited, and the insulating film 101 may be formed of an insulating film formed from an inorganic insulating material such as silicon oxide, silicon nitride, silicon oxide containing nitrogen, and silicon nitride containing oxygen, an organic insulating material such as acrylic or polyimide, or a material composed of a skeleton structure formed by the bond of silicon and oxygen, in which an organic group at least containing hydrogen (such as an alkyl group or aromatic hydrocarbon), a fluoro group, or an organic group at least containing hydrogen and a fluoro group, that is, a siloxane-based material.

Any one of a low molecular compound, a middle molecular compound, or a high molecular compound can be used as the material of the semiconductor layer 102, and a kind thereof is not particularly limited. As the material, a polycyclic aromatic compound, a conjugated double bond system compound, a macrocycle compound, a metal phthalocyanine complex, a charge-transfer type complex, condensed ring tetracarboxylic acid diimides, oligothiophenes, fullerenes, a carbon nanotube, and the like can be given as examples. For example, polypyrrole, polythiophene, poly(3-alkylthiophene), polythienylenevinylene, poly(p-phenylenevinylene), polyaniline, polyazulene, poly pyrene, poly carbazole, polyselenophene, polyfuran, poly(p-phenylene), polyindole, polypyridadine, anthracene, tetracene, pentacene, hexacene, heptacene, pyrene, chrysene, perylene, coronene, terylene, ovalene, quoterylene, triphenodioxazine, triphenodithiazine, hexacene-6,15-quinone, polyvinyl carbazole, polyphenylene sulfide, polyvinytene sulphide, polyvinyl pyridine, naphthalene tetracarboxylic acid diimide, anthracene tetracarboxylic acid diimide, $C_{60}$, $C_{70}$, $C_{76}$, $C_{78}$, $C_{84}$, and a derivative thereof can be used. In addition, as specific examples thereof, there are pentacene, sexithiophene (6T), copper phthalocyanine, bis-(1,2,5-thiadiazolo)-p-quinobis(1,3-dithiol), and rubrene which are generally considered as a p-type semiconductor, and 7,7,8,8-tetracyanoquinodimethane (abbreviation: TCNQ), 3,4,9,10-perylenetetracarboxylic dianhydride (abbreviation: PTCDA), 1,4,5,8,-naphthalenetetracarboxylic dianhydride (abbreviation: NTCDA), N,N'-dioctyl-3,4,9,10-perylenetracarboxylic diimide (abbreviation: PTCDI-C8H), copper hexadecafluoro phthalocyanine (abbreviation: $F_{16}$CuPc), 3',4'-dibutyl-5,5"-bis(dicyanomethylene)-5,5"-dihydro-2,2': 5',2"-terthiophene) (an abbreviation: DCMT), and the like which are generally considered as an n-type semiconductor. Note that, in an organic semiconductor, characteristics of a p-type and an n-type are not peculiar to the substance but depends on relation with an electrode for injecting a carrier or intensity of an electric field at the time of injection. Although there is a tendency that the substance is likely to become either an n-type or a p-type, there is a possibility of being a p-type, n-type, or a bipolar type. According to the present invention, at least part of the layer 103 made of the second composite material, the layer 104 made of the first composite material in the third electrode 108, and the like are provided to be in contact with the semiconductor layer 102. Accordingly, injection barriers of holes and electrons are decreased and it becomes possible to inject holes and electrons easily without applying a great amount of electric fields. Therefore, it becomes possible to inject both carriers of a hole and an electron even with a material which generally has been said a p-type or an n-type; thus, light emission can be obtained as a result of recombination. In such a manner, as for the material of the semiconductor layer 102 according to the present invention, it is possible to decrease increase of a drive voltage or the like even with the material which generally has been said a p-type or an n-type. Note that a drive voltage can be reduced further by using a material having a high bipolar property, which is an infinitely preferable structure.

Besides, it is possible to use the following materials as a compound that can be used as the material of the semiconductor layer 102 in a semiconductor element according to the present invention: 4,4'-bis[N-(1-naphthyl)-N-phenylamino]biphenyl (abbreviation: NPB), 4,4'-bis[N-(3-methylphenyl)-N-phenylamino]biphenyl (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis{N-[4-(N,N-di-m-tolylamino)phenyl]-N-phenylamino}biphenyl (abbreviation: DNTPD), 1,3,5-tris[N,N-di(m-tolyl)amino]benzene (abbreviation: m-MTDAB), 4,4',4"-tris(N-carbazolyl)triphenylamine (abbreviation: TCTA), phthalocyanine (abbreviation: $H_2Pc$), vanadyl phthalocyanine (abbreviation: VOPc), tris(8-quinolinolato)aluminum (abbreviation: $Alq_3$), 9,10-bis(2-naphthyl)anthracene (abbreviation: DNA), bis(2-methyl-8-quinolinolato)-4-phenylphenolato)aluminum (abbreviation: BAlq), or the like.

In addition, a material having a transporting property to holes or electrons, or the both as a host material is, for example, as a hole-transporting material, 4,4'-bis[N-(1-naphthyl)-N-phenylamino]biphenyl (abbreviation: NPB), 4,4'-bis[N-(3-methylphenyl)-N-phenylamino]biphenyl (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis{N-[4-(N,N-di-m-tolylamino)phenyl]-N-phenylamino}biphenyl (abbreviation: DNTPD), 1,3,5-tris[N,N-di(m-tolyl)amino]benzene (abbreviation: m-MTDAB), 4,4',4"-tris(N-carbazolyl)triphenylamine (abbreviation: TCTA), phthalocyanine (abbreviation: $H_2Pc$), copper phthalocyanine (CuPc), or vanadyl phthalocyanine (abbreviation: VOPc), as an electron-transporting material, a metal complex such as tris(8-quinolinolato)aluminum (abbreviation: $Alq_3$); tris(4-methyl-8-quinolinolato)aluminum (abbreviation: $Almq_3$); bis(10-hydroxybenzo[h]-quinolinato)beryllium (abbreviation: $BeBq_2$); bis(2-methyl-8-quinolinolato)-4-phenylphenolato-aluminum (abbreviation: BAlq); bis[2-(2-hydroxyphenyl)pyridinato]zinc (abbreviation: $Znpp_2$); bis[2-(2-hydroxyphenyl)benzoxazolato]zinc (abbreviation: $Zn(BOX)_2$); or bis[2-(2-hydroxyphenyl)benzothiazolato]zinc (abbreviation: $Zn(BTZ)_2$), an oxadiazole derivative such as 2-(4-biphenylyl)-5-(4-tert-buthylphenyl)-1,3,4-oxadiazole (abbreviation: PBD) or 1,3-bis[5-(p-tert-buthylphenyl)-1,3,4-oxadiazol-2-yl]benzene (abbreviation: OXD-7), a triazole derivative such as 3-(4-biphenylyl)-4-phenyl-5-(4-tert-buthylphenyl)-1,2,4-triazole (abbreviation: TAZ) or 3-(4-biphenylyl)-4-(4-ethylpheyl)-5-(4-tert-buthylphenyl)-1,2,4-triazole (abbreviation: p-EtTAZ), bathophenanthroline (abbreviation: BPhen), bathocuproin (abbreviation: BCP), 2,2',2"-(1,3,5-benzenetriyl)-tris(1-phenyl-1H-benzimidazole) (abbreviation: TPBI), or 4,4-bis(5-methylbenzoxazol-2-yl)stilbene (abbreviation: BzOs), and as a material having a bipolar property, an anthracene derivative such as poly(2,5-thienylenevinylene) (abbreviation: PTV); poly(3-hexylthiophene-2,5-diyl) (abbreviation: P3HT); poly(9,9'-dioctyl-fluorene-co-bithiophene) (abbreviation: F8T2); or 9,10-di(2-naphthyl)-2-tert-butylanthracene (abbreviation: t-BuDNA), a carbazole derivative such as 4,4'-bis(N-carbazolyl)biphenyl (abbreviation: CBP), or the like. As for the material having a transporting property to holes or electrons, or the both as a host material, a host-guest type mixture material where a material that serves as a light-emission center as a guest material is dispersed may be used. The material that serves as a light-emission center as a guest material may also be, for example, 9,10-di(2-naphthyl)anthracene (abbreviation: DNA), 2-tert-butyl-9,10-di(2-naphthyl)anthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthen, 2,5,8,11-tetra(tert-butyl)perylene (abbreviation: TBP), 9,10-diphenylanthracene (abbreviation: DPA), 5,12-diphenyltetracene, 4-dicyanomethylene)-2-methyl-6-[p-(dimethylamino)styryl]-4H-pyran (abbreviation: DCM1), 4-(dicyanomethylene)-2-methyl-6-[2-(julolidin-9-yl)ethenyl]-4H-pyran (abbreviation: DCM2), 4-(dicyanomethylene)-2,6-bis[p-(dimethylamino)styryl]-4H-pyran (abbreviation: BisDCM), bis[2-(4',6'-difluorophenyl)pyridinato-N,$C^{2'}$](picolinate)iridium (abbreviation: FIrpic), bis{2-[3',5'-bis(trifluoromethyl)phenyl]pyridinato-N,$C^{2'}$}(picolinate)iridium (abbreviation: $Ir(CF_3ppy)_2(pic)$), tris(2-phenylpyridinato-N,$C^{2'}$)iridium (abbreviation: $Ir(ppy)_3$), (acetylacetonato)bis(2-phenylpyridinato-N,$C^{2'}$)iridium (abbreviation: $Ir(ppy)_2(acac)$), (acetylacetonato)bis[2-(2'-thienyl)pyridinato-N,$C^{3'}$]iridium (abbreviation: $Ir(thp)_2(acac)$), (acetylacetonato)bis(2-phenylquinolinato-N,$C^{2'}$)iridium (abbreviation: $Ir(pq)_2(acac)$), or (acetylacetonato)bis[2-(2'-benzothienyl)pyridinato-N,$C^{3'}$]iridium (abbreviation: $Ir(btp)_2(acac)$). There is no limitation on the concentration of the guest material in the host material but the concentration is preferably approximately 5 to 8 wt. %.

The semiconductor layer 102 made of these materials may be formed by any of methods such as a CVD method, a sputtering method, a vapor deposition method, and a wet method.

The second composite material that forms the layer 103 made of the second composite material is a material composed of an inorganic compound and an organic compound having an electron-transporting property. As the inorganic compound, an alkaline metal and an alkaline earth metal, or oxide and nitride containing the metals are desirable and, specifically, lithium, natrium, potassium, cesium, magnesium, calcium, strontium, barium, lithium oxide, magnesium nitride, or calcium nitride is preferably used. In addition, as the organic compound having an electron-transporting property, perylenetetracarboxylic anhydride and a derivative thereof, a perylenetetracarboxy diimide derivative, naphthalentetracarboxylic anhydride and a derivative thereof, a naphthalentetracarboxydiimide derivative, a metal phthalocyanine derivative, or fullerenes can be used. Additionally, a material made of a metal complex or the like having a quinoline skeleton or a benzoquinoline skeleton such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), or bis(2-methyl-8-quinolinolato)-4-phenylphenolato-aluminum (abbreviation: BAlq), or the like can be used. Besides, a material such as a metal complex having an oxazole-based ligand or a thiazole-based ligand such as bis[2-(2-hydroxyphenyl)benzoxazolato]zinc (abbreviation: $Zn(BOX)_2$) or bis[2-(2-hydroxyphenyl)benzothiazolato]zinc (abbreviation: $Zn(BTZ)_2$) can also be used. Further, other than the metal complex, 2-(4-biphenylyl)-5-(4-tert-buthylphenyl)-1,3,4-oxadiazole (abbreviation: PBD), 1,3-bis[5-(p-tert-buthylphenyl)-1,3,4-oxadiazol-2-yl]benzene (abbreviation: OXD-7), 3-(4-tert-buthylphenyl)-4-phenyl-5-(4-biphenylyl)-1,2,4-triazole (abbreviation: TAZ), 3-(4-tert-buthylphenyl)-4-(4-ethylpheyl)-5-(4-biphenylyl)-1,2,4-triazole (abbreviation: p-EtTAZ), bathophenanthroline (abbreviation: BPhen), bathocuproin (abbreviation: BCP), or the like can be used. The layer 103 made of the second composite material can be manufactured by an alkaline metal and an alkaline earth metal, a co-evaporation method with oxide or nitride containing the metals and the organic compound having an electron-transporting property. However, the layer 103 made of the second composite material may also be formed by any of a wet method and other known methods.

The first composite material that forms the layer 104 made of the first composite material is a material composed of an inorganic compound and an organic compound having a hole-transporting property. As the inorganic compound, oxide or nitride of a transition metal are desirable and, specifically, zirconium oxide, hafnium oxide, vanadium oxide, niobium oxide, tantalum oxide, chromium oxide, molybdenum oxide, tungsten oxide, titanium oxide, manganese oxide, or rhenium oxide is preferably used. In addition, as the organic compound having a hole-transporting property, an organic material having an arylamino group such as 4,4'-bis[N-(1-naphthyl)-N-phenylamino]biphenyl (abbreviation: NPB); 4,4'-bis[N-(3-methylphenyl)-N-phenylamino]biphenyl (abbreviation: TPD); 4,4',4''-tris(N,N-diphenylamino)triphenylamine (abbreviation: TDATA); 4,4',4''-tris[N-(3-methylphenyl)-N-phenylamino]triphenylamine (abbreviation: MTDATA); 4,4'-bis{N-[4-(N,N-di-m-tolylamino)phenyl]-N-phenylamino}biphenyl (abbreviation: DNTPD); 1,3,5-tris[N,N-di(m-tolyl)amino]benzene (abbreviation: m-MTDAB); or 4,4',4''-tris(N-carbazolyl)triphenylamine (abbreviation: TCTA), phthalocyanine (abbreviation: H$_2$Pc), copper phthalocyanine (CuPc), vanadyl phthalocyanine (abbreviation: VOPc), or the like can also be used.

In addition, such an organic material that will be represented by the following general formula (1) can also be preferably used. As the specific examples, 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and the like can be given. The first composite material using an organic compound having this structure is superior in thermal stability and reliability.

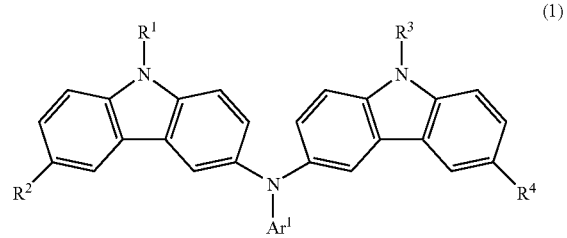

(1)

In the formula, each of $R^1$ and $R^3$ may be the same or different, which represents any of hydrogen; an alkyl group having 1 to 6 carbon atoms; an aryl group having 6 to 25 carbon atoms; a heteroaryl group having 5 to 9 carbon atoms; an arylalkyl group; and an acyl group having 1 to 7 carbon atoms, $Ar^1$ represents any of an aryl group having 6 to 25 carbon atoms and a heteroaryl group having 5 to 9 carbon atoms, $R^2$ represents any of hydrogen; an alkyl group having 1 to 6 carbon atoms; and an aryl group having 6 to 12 carbon atoms, and $R^4$ represents any of hydrogen; an alkyl group having 1 to 6 carbon atoms; an aryl group having 6 to 12 carbon atoms; and a substituent that will be represented by a general formula (2). In the substituent represented by the general formula (2), $R^5$ represents any of hydrogen; an alkyl group having 1 to 6 carbon atoms; an aryl group having 6 to 25 carbon atoms; a heteroaryl group having 5 to 9 carbon atoms; an arylalkyl group; and an acyl group having 1 to 7 carbon atoms, $Ar^2$ represents any of an aryl group having 6 to 25 carbon atoms and a heteroaryl group having 5 to 9 carbon atoms, and $R^6$ represents any of hydrogen; an alkyl group having 1 to 6 carbon atoms; and an aryl group having 6 to 12 carbon atoms.

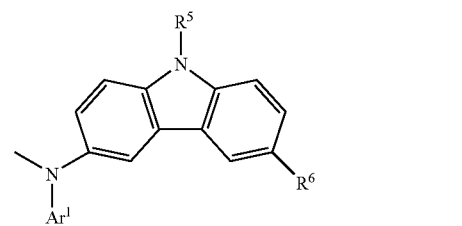

(2)

In addition, such an organic material that will be represented by any of the following general formulas (3) to (6) can also be preferably used. As the specific examples of such an organic compound that will be represented by any of the following general formulas (3) to (6), N-(2-naphthyl)carbazole (abbreviation: NCz), 4,4'-di(N-carbazolyl)biphenyl (abbreviation: CBP), 9,10-bis[4-(N-carbazolyl)phenyl]anthracene (abbreviation: BCPA), 3,5-bis[4-(N-carbazolyl)phenyl]biphenyl (abbreviation: BCPBi), 1,3,5-tris[4-(N-carbazolyl)phenyl]benzene (abbreviation: TCPB), and the like can be given.

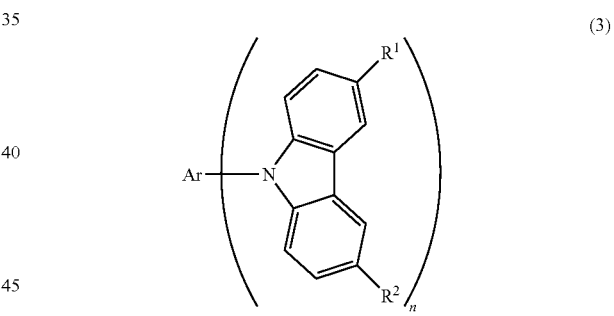

(3)

In the formula, Ar represents an aromatic hydrocarbon group having 6 to 42 carbon atoms, n represents a natural number of 1 to 3, and $R^1$ and $R^2$ represent hydrogen; an alkyl group having 1 to 4 carbon atoms; or an aryl group having 6 to 12 carbon atoms.

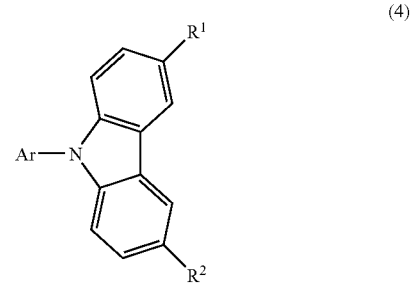

(4)

In the formula, Ar represents a monovalent aromatic hydrocarbon group having 6 to 42 carbon atoms, and $R^1$ and $R^2$ represent hydrogen; an alkyl group having 1 to 4 carbon atoms; or an aryl group having 6 to 12 carbon atoms.

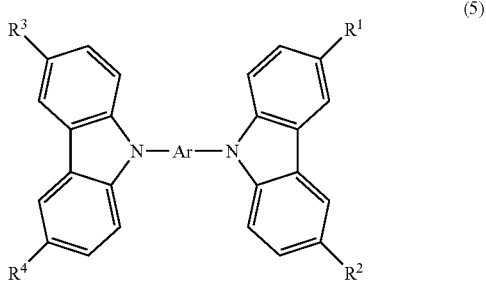

(5)

In the formula, Ar represents a bivalent aromatic hydrocarbon group having 6 to 42 carbon atoms, and $R^1$ to $R^4$ represent hydrogen; an alkyl group having 1 to 4 carbon atoms; or an aryl group having 6 to 12 carbon atoms.

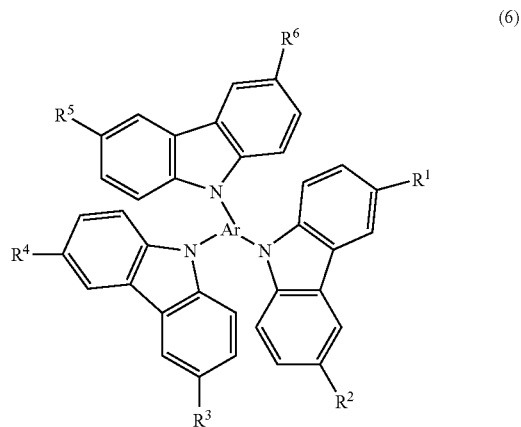

(6)

However, in the formula, Ar represents a trivalent aromatic hydrocarbon group having 6 to 42 carbon atoms, and $R^1$ to $R^6$ represents hydrogen; an alkyl group having 1 to 4 carbon atoms; or an aryl group having 6 to 12 carbon atoms.

Further, it is also possible to use aromatic hydrocarbon such as anthracene, 9,10-diphenylanthracene (abbreviation: DPA), 2-tert-butyl-9,10-di(2-naphthyl)anthracene (abbreviation: t-BuDNA), tetracene, rubrene, or pentacene.

Although the layer 104 made of the first composite material can be manufactured by a co-evaporation method with the above inorganic compound and organic compound having a hole-transporting property, the layer 104 may be formed by any of a wet method and other methods. Note that, in the layer 104 made of the first composite material, it is desirable that the organic compound and inorganic compound have a weight ratio of 95:5 to 20:80, and preferably 90:10 to 50:50.

A semiconductor element according to the present invention which have such a structure has the layer 103 made of the second composite material in a portion where the second electrode 107 is in contact with the semiconductor layer 102; therefore, there is small energy barrier for injecting electrons into the semiconductor layer 102 from the second electrode 107. In addition, the semiconductor element has the layer 104 made of the first composite material in a portion where the third electrode 108 is in contact with the semiconductor layer 102; therefore, there is small energy barrier for injecting holes into the semiconductor layer 102 from the third electrode 108. Accordingly, the semiconductor element according to the present invention can be a semiconductor element having a low drive voltage. Moreover, in a conventional structure where another material is used instead of the first and second composite materials for the second electrode 107 and the third electrode 108, there is restriction by a work function in selecting a conductive layer for forming the second electrode 107 and the third electrode 108, and the range of selection is extremely narrow in consideration of other characteristics such as conductivity or stability. On the other hand, just by providing the layer 103 made of the second composite material and the layer 104 made of the first composite material each to be in contact with the semiconductor layer 102, in the second electrode 107 and the third electrode 108 in the semiconductor element according to the present invention, the conductive layer 105a and the conductive layer 105b may have conductivity to some extent and the material described above can be used preferably; thus, the range of the selection can be expanded extremely widely.

Further, both the layer 104 made of the first composite material or the layer 103 made of the second composite material can be formed by a vapor deposition method or a wet method, and it is also possible to manufacture a semiconductor element according to the present invention simply and easily.

Furthermore, in the semiconductor element according to the present invention, electrons are injected into the semiconductor layer 102 from the second electrode 107 and the holes are injected into the semiconductor layer 102 from the third electrode 108 by an electric field generated by applying voltage above a certain level so that voltage on the third electrode side gets higher than that on the second electrode side between the second electrode 107 and the third electrode 108. The injected holes and electrons are recombined in the semiconductor layer 102, molecules in the semiconductor layer 102 are excited, and thus, light emission can be obtained from the semiconductor layer 102 upon the excited molecules returning to a ground state. At this time, the injection amount of electrons or holes can be changed without changing current or voltage that is applied between the second electrode 107 and the third electrode 108 by applying voltage to the first electrode 100 and changing the voltage; therefore, it is possible to control light emission.

In addition, since it is possible to control light emission without providing a driving transistor and a light-emitting element separately, an aperture ratio is improved, which is advantageous in high resolution. Moreover, since the number of manufacturing processes is small, a light-emitting device according to the present invention provided with a function for controlling a semiconductor element, or an organic transistor or an organic light-emitting transistor according to the present invention can have few incidence of a defective product with the use thereof; thus, a light-emitting device in a preferable yield can be obtained.

Figure 1B:
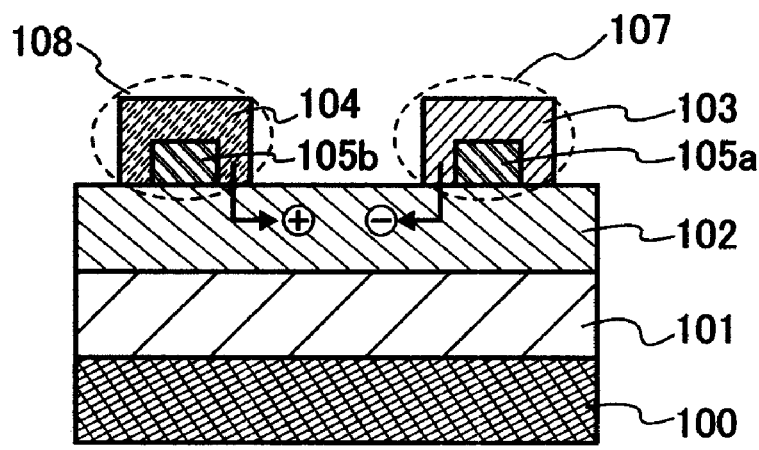

A semiconductor element according to the present invention having different structure is shown in FIG. 1B. The semiconductor element according to the present invention illustrated in FIG. 1B includes a first electrode 100, an insulating film 101, a semiconductor layer 102, a second electrode 107, and a third electrode 108.

The first electrode 100 is formed over an arbitrary insulator such as an insulating substrate or an insulating film which is not shown, and the insulating film 101 electrically insulates the semiconductor layer 102 and the first electrode 100. In addition, the second electrode 107 is formed of two layers of a conductive layer 105a and a layer 103 made of a second composite material, and the third electrode 108 is formed of two layers of a conductive layer 105b and a layer 104 made of a first composite material, respectively. The layer 103 made of the second composite material in the second electrode 107 and the layer 104 made of the first composite material in the third electrode 108 are provided so that at least parts thereof are in contact with the semiconductor layer 102. The conductive layer 105a and the conductive layer 105b are formed inside enough that each of peripheries thereof does not reach peripheries of the layer 103 made of the second composite material and the layer 104 made of the first composite material. In other words, the semiconductor element in FIG. 1B is different from that in FIG. 1A, and the layer 103 made of the second composite material, the layer 104 made of the first composite material, the conductive layer 105a, and the conductive layer 105b are each formed so as to be in contact with the semiconductor layer 102. Therefore, the layer 103 made of the second composite material and the layer 104 made of the first composite material are formed so as to cover the surface of the conductive layer 105a and the conductive layer 105b.

Note that the other structure, material, and effect of the semiconductor element according to the present invention illustrated in FIG. 1B is the same as those in FIG. 1A; therefore, the illustration in FIG. 1B follows that in FIG. 1A and the repeated explanation will be omitted.

Figure 1C:
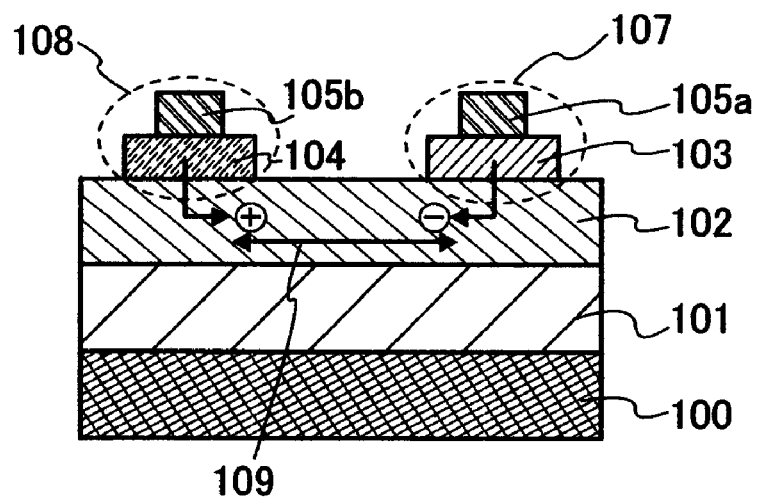

A semiconductor element according to the present invention having different structure is shown in FIG. 1C. The semiconductor element according to the present invention illustrated in FIG. 1C includes a first electrode 100, an insulating film 101, a semiconductor layer 102, a second electrode 107, and a third electrode 108.

The first electrode 100 is formed over an arbitrary insulator such as an insulating substrate or an insulating film which is not shown, and the insulating film 101 electrically insulates the semiconductor layer 102 and the first electrode 100. In addition, the second electrode 107 is formed of two layers of a conductive layer 105a and a layer 103 made of a second composite material, and the third electrode 108 is formed of two layers of a conductive layer 105b and a layer 104 made of a first composite material, respectively. The layer 103 made of the second composite material in the second electrode 107 and the layer 104 made of the first composite material in the third electrode 108 are provided so as to be in contact with the semiconductor layer 102. The conductive layer 105a and the conductive layer 105b are formed inside enough that each of peripheries thereof does not reach peripheries of the layer 103 made of the second composite material and the layer 104 made of the first composite material, and the conductive layers are not in contact with the semiconductor layer 102. In other words, as well as in FIG. 1A, the conductive layer 105a and the conductive layer 105b are not in contact with the semiconductor layer 102 in the semiconductor element in FIG. 1C. The conductive layer 105a is formed so that a width thereof (a length in a channel length direction 109) gets shorter than a width of the layer 103 made of the second composite material (the length in the channel length direction 109), which is different from FIG. 1A. In addition, the conductive layer 105b is also formed so that a width thereof (the length in the channel length direction 109) gets shorter than a width of the layer 104 made of the first composite material (the length in the channel direction 109).

In the case where the electrode is disposed over the semiconductor layer 102 as illustrated in FIGS. 1A to 1C, the surface of the semiconductor layer 102 is damaged in forming the electrode; thus, a performance as a semiconductor element is deteriorated in some cases. However, in such a structure as FIG. 1C, the conductive layer 105a and the conductive layer 105b are formed inside enough that each of peripheries thereof does not reach peripheries of the layer 103 made of the second composite material and the layer 104 made of the first composite material, and the conductive layers are not in contact with the semiconductor layer 102. Therefore, it becomes possible to form a metal conductive layer without damaging the semiconductor layer 102. Specifically, the conductive layers may be formed only over the layers made of the composite materials with the use of a mask.

Note that the other structure, material, and effect of the semiconductor element according to the present invention illustrated in FIG. 1C is the same as those in FIG. 1A; therefore, the illustration in FIG. 1C follows that in FIG. 1A and the repeated explanation will be omitted.

Figure 2A:
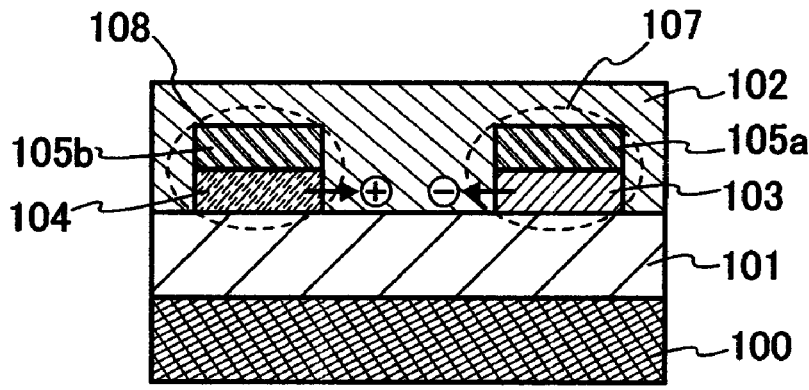
FIGS. 2A to 2C are each a schematic cross-sectional view of an organic light-emitting transistor according to the present invention.

A semiconductor element according to the present invention having different structure is shown in FIG. 2A. The semiconductor element according to the present invention illustrated in FIG. 2A includes a first electrode 100, an insulating film 101, a semiconductor layer 102, a second electrode 107, and a third electrode 108.

The first electrode 100 is formed over an arbitrary insulator such as an insulating substrate or an insulating film, which is not shown, and the insulating film 101 electrically insulates the first electrode 100 from the semiconductor layer 102, the second electrode 107, and the third electrode 108. The second electrode 107 and the third electrode 108 are formed in contact with the insulating film 101, and the semiconductor layer 102 is formed to cover the insulating film 101, the second electrode 107, and the third electrode 108.

In addition, the second electrode 107 is formed of two layers of a conductive layer 105a and a layer 103 made of a second composite material, and the third electrode 108 is formed of two layers of a conductive layer 105b and a layer 104 made of a first composite material, respectively. The layer 103 made of the second composite material in the second electrode 107 and the layer 104 made of the first composite material in the third electrode 108 are provided so that at least parts thereof are in contact with the semiconductor layer 102. The conductive layer 105a and the conductive layer 105b may be formed inside enough that each of peripheries thereof does not reach peripheries of the layer 103 made of the second composite material and the layer 104 made of the first composite material. In other words, the conductive layer 105a and the conductive layer 105b are not in contact with the insulating film 101, and the conductive layer 105a may be formed so that a width thereof (the length in a channel length direction) gets shorter than a width of the layer 103 made of the second composite material (the length in the channel length direction). In addition, the conductive layer 105b may also be formed so that a width thereof (the length in the channel length direction) gets shorter than a width of the layer 104 made of the first composite material (the length in the channel length direction).

In the second electrode 107 and the third electrode 108 in FIG. 2A, the layer 103 made of the second composite material and the layer 104 made of the first composite material are each formed closer to the first electrode 100, and the conductive layer 105a and the conductive layer 105b are formed far from the insulating film 101. However, as in FIG. 2C, the conductive layer 105a and the conductive layer 105b may be formed closer to the first electrode 100, and the layer 103 made of the second composite material and the layer 104 made of the first composite material may be formed far from the insulating film 101. In such a structure as FIG. 2C, an area where the semiconductor layer 102 and the layer 103 made of the second composite material are in contact with each other and an area where the layer 104 made of the first composite material and the semiconductor layer 102 are in contact with each other get larger; therefore, FIG. 2C is a structure advantage in injecting holes and electrons. The structure in FIG. 2C is the same as that in FIG. 2A other than the order of the stacked layer of the electrodes.

Note that the other structure, material, and effect of the semiconductor element according to the present invention illustrated in FIGS. 2A and 2C are the same as those in FIG. 1A; therefore, the illustration in FIGS. 2A and 2C follow that in FIG. 1A and the repeated explanation will be omitted.

Figure 2B:
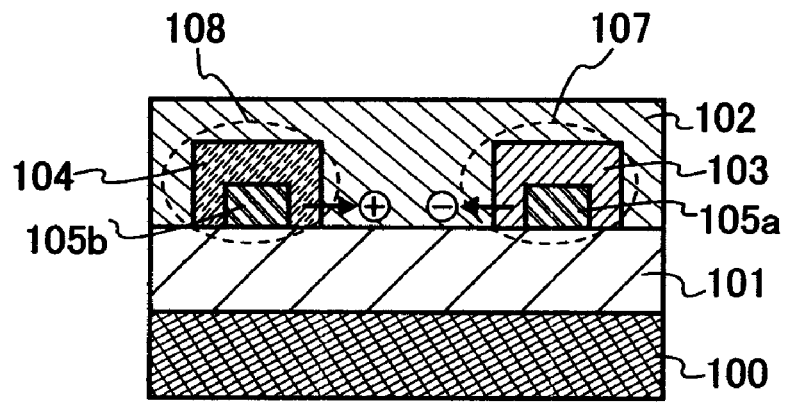
Figure 2C:
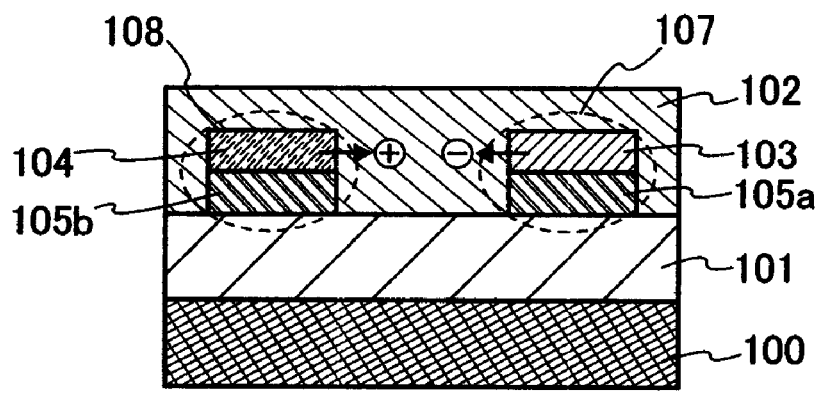

A semiconductor element according to the present invention having different structure is shown in FIG. 2B. The semiconductor element according to the present invention illustrated in FIG. 2B includes a first electrode 100, an insulating film 101, a semiconductor layer 102, a second electrode 107, and a third electrode 108.

The first electrode 100 is formed over an arbitrary insulator such as an insulating substrate or an insulating film, which is not shown, and the insulating film 101 electrically insulates the first electrode 100 from the semiconductor layer 102, the second electrode 107, and the third electrode 108. The second electrode 107 and the third electrode 108 are formed in contact with the insulating film 101, and the semiconductor layer 102 is formed to cover the insulating film 101, the second electrode 107, and the third electrode 108.

In addition, the second electrode 107 is formed of two layers of a conductive layer 105a and a layer 103 made of a second composite material, and the third electrode 108 is formed of two layers of a conductive layer 105b and a layer 104 made of a first composite material, respectively. The layer 103 made of the second composite material in the second electrode 107 and the layer 104 made of the first composite material in the third electrode 108 are provided so that at least parts thereof are in contact with the semiconductor layer 102. The conductive layer 105a and the conductive layer 105b are formed inside enough that each of peripheries thereof does not reach peripheries of the layer 103 made of the second composite material and the layer 104 made of the first composite material. In other words, the semiconductor element in FIG. 2B is different from those in FIGS. 2A and 2C, and the layer 103 made of the second composite material, the layer 104 made of the first composite material, the conductive layer 105a, and the conductive layer 105b are each formed so as to be in contact with the insulating film 101. Therefore, the layer 103 made of the second composite material and the layer 104 made of the first composite material are formed so as to cover the surface of the conductive layer 105a and the conductive layer 105b, and the conductive layer 105a and the conductive layer 105b have a structure where the conductive layers are not in contact with the semiconductor layer 102.

Note that the other structure, material, and effect of the semiconductor element according to the present invention illustrated in FIG. 2B is the same as those in FIG. 1A; therefore, the illustration in FIG. 2B follows that in FIG. 1A and the repeated explanation will be omitted.

Figure 3A:
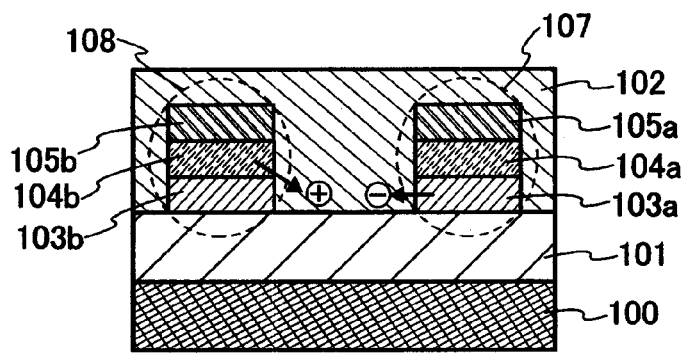
FIGS. 3A to 3D are each a schematic cross-sectional view of an organic light-emitting transistor according to the present invention.

A semiconductor element according to the present invention having different structure is shown in FIG. 3A. The semiconductor element according to the present invention illustrated in FIG. 3A includes a first electrode 100, an insulating film 101, a semiconductor layer 102, a second electrode 107, and a third electrode 108.

The first electrode 100 is formed over an arbitrary insulator such as an insulating substrate or an insulating film, which is not shown, and the insulating film 101 electrically insulates the first electrode 100 from the semiconductor layer 102, the second electrode 107, and the third electrode 108. The second electrode 107 and the third electrode 108 are formed in contact with the insulating film 101, and the semiconductor layer 102 is formed to cover the insulating film 101, the second electrode 107, and the third electrode 108.

In addition, the second electrode 107 is formed of three layers of a conductive layer 105a, a layer 103a made of a second composite material, and a layer 104a made of a first composite material, and the third electrode 108 is formed of three layers of a conductive layer 105b, a layer 103b made of a second composite material, and a layer 104b made of a first composite material, respectively. The layer 103a made of the second composite material in the second electrode 107 and the layer 104b made of the first composite material in the third electrode 108 are provided so that at least parts thereof are in contact with the semiconductor layer 102. In addition, the layer 104a made of the first composite material and the layer 103a made of the second composite material in the second electrode 107 are provided so that at least parts thereof are in contact with each other, and the layer 104b made of the first composite material and the layer 103b made of the second composite material in the third electrode 108 are provided so that at least parts thereof are in contact with each other. The conductive layer 105a and the conductive layer 105b may be formed inside enough that each of peripheries thereof does not reach peripheries of the layers made of these composite materials. In other words, the conductive layer 105a and the conductive layer 105b are not in contact with the insulating film 101, and the conductive layer 105a may be formed so that a width thereof (the length in a channel length direction) gets shorter than a width of the layer 103a made of the second composite material (the length in the channel length direction). In addition, the conductive layer 105b may also be formed so that a width thereof (the length in the channel length direction) gets shorter than a width of the layer 104b made of the first composite material (the length in the channel length direction).

Note that the layers 103a and 103b made of the second composite materials can be formed with the material of the layer 103 made of the second composite material explained in FIG. 1A, and the layers 104a and 104b made of first composite materials can be formed with the material of the layer 104 made of the first composite material explained in FIG. 1A.

In the semiconductor element according to the present invention illustrated in FIG. 3A, the second electrode 107 and the third electrode 108 each have both the layer made of the second composite material and the layer made of the first composite material. Further, since the layer made of the second composite material and the layer made of the first composite material are in contact with each other, it becomes possible to improve injectability of electrons or holes and to reduce a drive voltage much more.

In addition, in the structure illustrated in FIG. 3A, it is possible to manufacture the second electrode 107 and the third electrode 108 by repeating deposition only three times with the same mask. Therefore, it is possible to obtain a semiconductor element that can be manufactured simply and easily much more. Note that the order of stacking the layer made of the first composite material and the layer made of the second composite material may be reversed.

Note that the other structure, material, and effect of the semiconductor element according to the present invention illustrated in FIG. 3A is the same as those in FIG. 1A; therefore, the illustration in FIG. 3A follows that in FIG. 1A and the repeated explanation will be omitted.

Figure 3B:
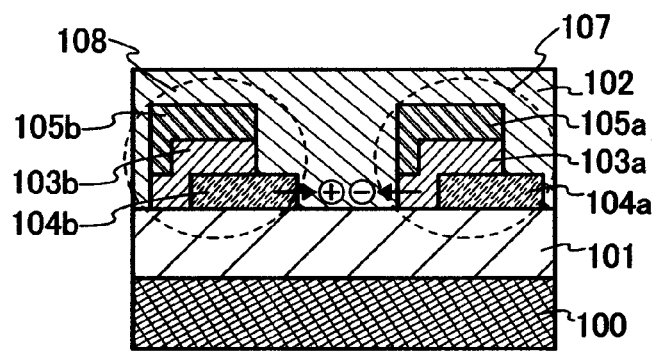

A semiconductor element according to the present invention having different structure is shown in FIG. 3B. The semiconductor element according to the present invention illustrated in FIG. 3B includes a first electrode 100, an insulating film 101, a semiconductor layer 102, a second electrode 107, and a third electrode 108.

The first electrode 100 is formed over an arbitrary insulator such as an insulating substrate or an insulating film, which is not shown, and the insulating film 101 electrically insulates the first electrode 100 from the semiconductor layer 102, the second electrode 107, and the third electrode 108. The second electrode 107 and the third electrode 108 are formed in contact with the insulating film 101, and the semiconductor layer 102 is formed to cover the insulating film 101, the second electrode 107, and the third electrode 108.

In addition, the second electrode 107 is formed of three layers of a conductive layer 105a, a layer 103a made of a second composite material, and a layer 104a made of a first composite material, and the third electrode 108 is formed of three layers of a conductive layer 105b, a layer 103b made of a second composite material, and a layer 104b made of a first composite material, respectively. The layer 103a made of the second composite material in the second electrode 107 and the layer 104b made of the first composite material in the third electrode 108 are provided so that at least parts thereof are in contact with the semiconductor layer 102. In addition, the layer 104a made of the first composite material and the layer 103a made of the second composite material in the second electrode 107 are provided so that at least parts thereof are in contact with each other, and the layer 104b made of the first composite material and the layer 103b made of the second composite material in the third electrode 108 are provided so that at least parts thereof are in contact with each other. The conductive layer 105a and the conductive layer 105b may be formed inside enough that each of peripheries thereof does not reach peripheries of the layers made of these composite materials. In other words, the conductive layer 105a and the conductive layer 105b are not in contact with the insulating film 101, and the conductive layer 105a may be formed so that a width thereof (the length in a channel length direction) gets shorter than a width of the layer 103a made of the second composite material (the length in the channel length direction). In addition, the conductive layer 105b may also be formed so that a width thereof (the length in the channel length direction) gets shorter than a width of the layer 104b made of the first composite material (the length in the channel length direction).

Note that the layers 103a and 103b made of the second composite materials can be formed with the material of the layer 103 made of the second composite material explained in FIG. 1A, and the layers 104a and 104b made of first composite materials can be formed with the material of the layer 104 made of the first composite material explained in FIG. 1A.

In the semiconductor element according to the present invention illustrated in FIG. 3B, the second electrode 107 and the third electrode 108 each have both the layer made of the second composite material and the layer made of the first composite material. Further, since the layer made of the second composite material and the layer made of the first composite material are in contact with each other, it becomes possible to improve injectability of electrons or holes and to reduce a drive voltage much more. Note that, in the semiconductor element according to the present invention illustrated in FIG. 3B, a portion where the layer 103a made of the second composite material is in contact with the semiconductor layer 102 is placed closer to the third electrode 108 side than the layer 104a made of the first composite material in the second electrode 107 on the side for injecting electrons. In the third electrode 108 on the side for injecting holes, a portion where the layer 104b made of the first composite material is in contact with the semiconductor layer 102 is placed closer to the second electrode 107 side than the layer 103b made of the second composite material. Therefore, it is considered that recombination possibility or injection efficiency is improved, which is a preferable structure.

In addition, in the structure illustrated in FIG. 3B, it is possible to manufacture the second electrode 107 and the third electrode 108 only with the second layer and the third layer deposited by slightly moving the same mask after depositing the first layer, among the three layers of the second electrode 107 and the third electrode 108. Therefore, it is possible to obtain a semiconductor element that can be manufactured simply and easily much more. Note that the order of stacking the layer made of the first composite material and the layer made of the second composite material may be reversed. However, the shape of the second electrode 107 and the third electrode 108 are also reversed so that a portion where the layer 103a made of the second composite material is in contact with the semiconductor layer 102 is placed closer to the third electrode 108 side than the layer 104a made of the first composite material in the second electrode 107 on the side for injecting electrons, and, in the third electrode 108 on the side for injecting holes, a portion where the layer 104b made of the first composite material is in contact with the semiconductor layer 102 is placed closer to the second electrode 107 side than the layer 103b made of the second composite material.

Note that the other structure, material, and effect of the semiconductor element according to the present invention illustrated in FIG. 3B is the same as those in FIG. 1A; therefore, the illustration in FIG. 3B follows that in FIG. 1A and the repeated explanation will be omitted.

Figure 3C:
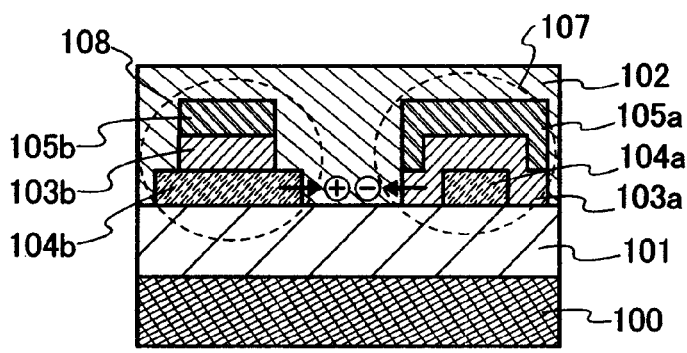

A semiconductor element according to the present invention having different structure is shown in FIG. 3C. The semiconductor element according to the present invention illustrated in FIG. 3C includes a first electrode 100, an insulating film 101, a semiconductor layer 102, a second electrode 107, and a third electrode 108.

The first electrode 100 is formed over an arbitrary insulator such as an insulating substrate or an insulating film, which is not shown, and the insulating film 101 electrically insulates the first electrode 100 from the semiconductor layer 102, the second electrode 107, and the third electrode 108. The second electrode 107 and the third electrode 108 are formed in contact with the insulating film 101, and the semiconductor layer 102 is formed to cover the insulating film 101, the second electrode 107, and the third electrode 108.

In addition, the second electrode 107 is formed of three layers of a conductive layer 105a, a layer 103a made of a second composite material, and a layer 104a made of a first composite material, and the third electrode 108 is formed of three layers of a conductive layer 105b, a layer 103b made of a second composite material, and a layer 104b made of a first composite material, respectively. The layer 103a made of the second composite material in the second electrode 107 and the layer 104b made of the first composite material in the third electrode 108 are provided so that at least parts thereof are in contact with the semiconductor layer 102. In addition, the layer 104a made of the first composite material and the layer 103a made of the second composite material in the second electrode 107 are provided so that at least parts thereof are in contact with each other, and the layer 104b made of the first composite material and the layer 103b made of the second composite material in the third electrode 108 are provided so that at least parts thereof are in contact with each other. The conductive layer 105a and the conductive layer 105b may be formed inside enough that each of peripheries thereof does not reach peripheries of the layers made of these composite materials. In other words, the conductive layer 105a and the conductive layer 105b are not in contact with the insulating film 101, and the conductive layer 105a may be formed so that a width thereof (the length in a channel length direction) gets shorter than a width of the layer 103a made of the second composite material (the length in the channel length direction). In addition, the conductive layer 105b may also be formed so that a width thereof (the length in the channel length direction) gets shorter than a width of the layer 104b made of the first composite material (the length in the channel length direction).

Note that the layers 103a and 103b made of the second composite materials can be formed with the material of the layer 103 made of the second composite material explained in FIG. 1A, and the layers 104a and 104b made of first composite materials can be formed with the material of the layer 104 made of the first composite material explained in FIG. 1A.

In the semiconductor element according to the present invention illustrated in FIG. 3C, the second electrode 107 and the third electrode 108 each have both the layer made of the second composite material and the layer made of the first composite material. Further, since the layer made of the second composite material and the layer made of the first composite material are in contact with each other, it becomes possible to improve injectability of electrons or holes and to reduce a drive voltage much more. Note that, in the semiconductor element according to the present invention illustrated in FIG. 3B, a portion where the layer 103a made of the second composite material is in contact with the semiconductor layer 102 is placed closer to the third electrode 108 side than the layer 104a made of the first composite material in the second electrode 107 on the side for injecting electrons. In the third electrode 108 on the side for injecting holes, a portion where the layer 104b made of the first composite material is in contact with the semiconductor layer 102 is placed closer to the second electrode 107 side than the layer 103b made of the second composite material. Therefore, it is considered that recombination possibility or injection efficiency is improved, which is a preferable structure. Note that the order of stacking the layer made of the first composite material and the layer made of the second composite material may be reversed. However, the shape of the second electrode 107 and the third electrode 108 are also reversed so that a portion where the layer 103a made of the second composite material is in contact with the semiconductor layer 102 is placed closer to the third electrode 108 side than the layer 104a made of the first composite material in the second electrode 107 on the side for injecting electrons, and, in the third electrode 108 on the side for injecting holes, a portion where the layer 104b made of the first composite material is in contact with the semiconductor layer 102 is placed closer to the second electrode 107 side than the layer 103b made of the second composite material.

Figure 3D:
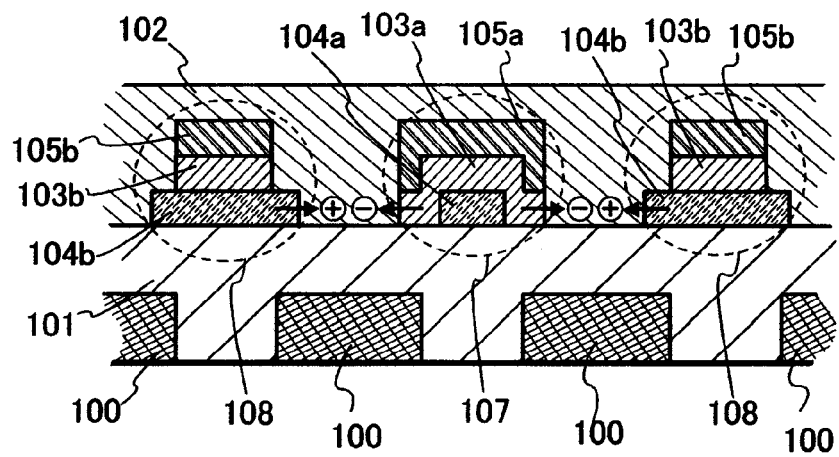
Figure 4:
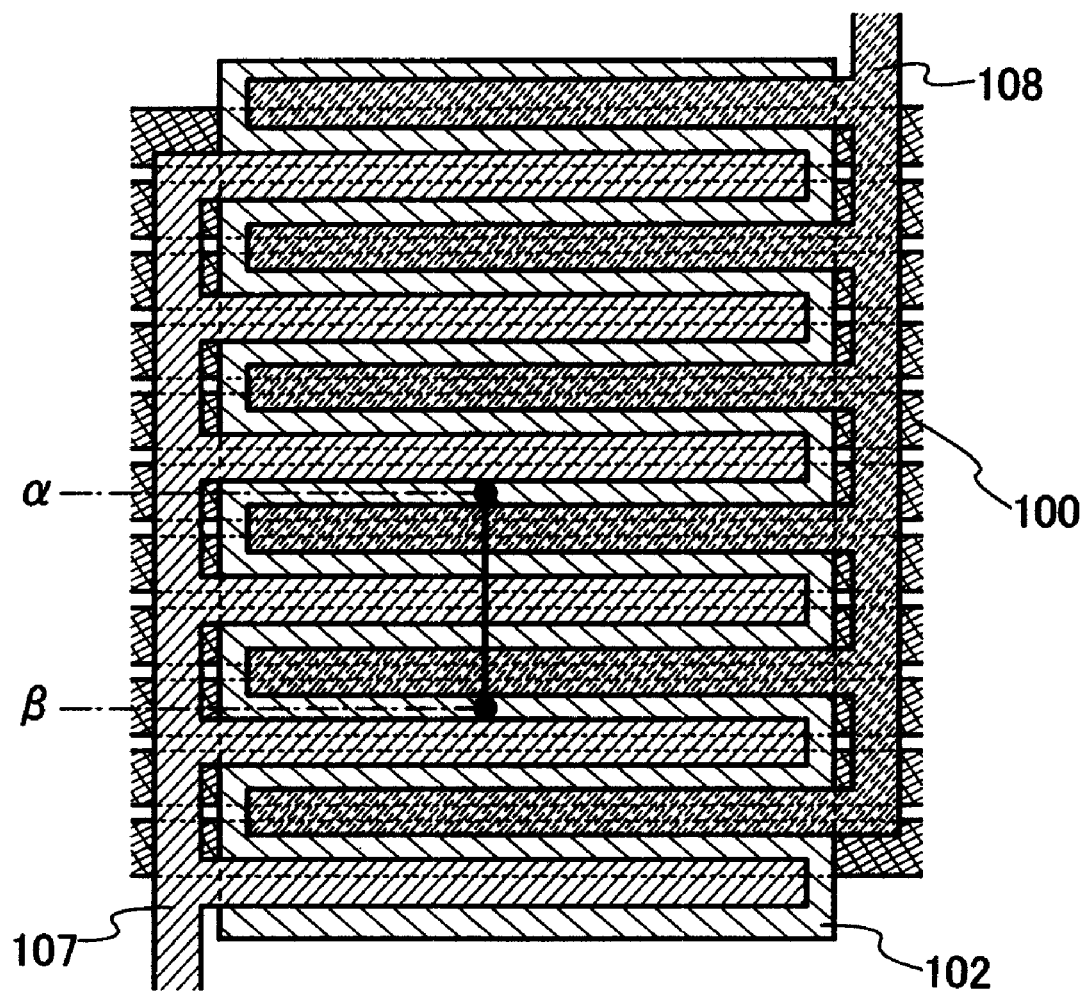
FIG. 4 is a schematic top view of an organic light-emitting transistor according to the present invention.

FIG. 3D, having a comb-shape electrode as shown in FIG. 4, is an application example of FIG. 3C and an example of applying the semiconductor element the shape of which is in FIG. 3C in a case of a structure where many semiconductor elements are connected. FIG. 3D corresponds to a cross-sectional view taken along α-β in FIG. 4. In this structure, the third electrode 108 exists on the both sides of the second electrode 107 and light emission can be obtained through the semiconductor layer 102 on either side. In addition, light emission can be controlled separately by the first electrodes 100 provided separately. Of course, the first electrode 100 may be identical. Moreover, although not shown, the third electrode 108 is provided on the both sides of the second electrode 107, and FIG. 3D is a structure where such a structure is provided repeatedly.

Note that the other structure, material, and effect of the semiconductor element according to the present invention illustrated in FIG. 3C is the same as those in FIG. 1A; therefore, the illustration in FIG. 3C follows that in FIG. 1A and the repeated explanation will be omitted.

Figure 5A:
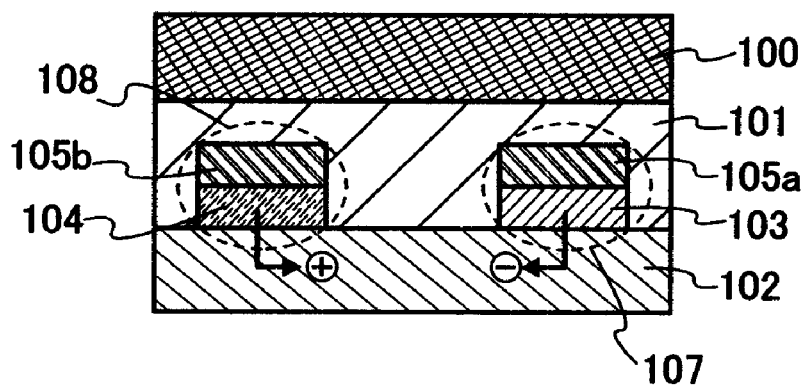
FIGS. 5A to 5C are each a schematic cross-sectional view of an organic light-emitting transistor according to the present invention.

A semiconductor element according to the present invention having different structure is shown in FIG. 5A. The semiconductor element according to the present invention illustrated in FIG. 5A includes a first electrode 100, an insulating film 101, a semiconductor layer 102, a second electrode 107, and a third electrode 108.

The semiconductor layer 102 is formed over an arbitrary insulator such as an insulating substrate or an insulating film, which is not shown, and the insulating film 101 electrically insulates the first electrode 100 from the semiconductor layer 102, the second electrode 107, and the third electrode 108. The second electrode 107 and the third electrode 108 are formed over the semiconductor layer 102, and the insulating film 101 is formed to cover the semiconductor layer 102, the second electrode 107, and the third electrode 108.

In addition, the second electrode 107 is formed of two layers of a conductive layer 105a and a layer 103 made of a second composite material, and the third electrode 108 is formed of two layers of a conductive layer 105b and a layer 104 made of a first composite material, respectively. The layer 103 made of the second composite material in the second electrode 107 and the layer 104 made of the first composite material in the third electrode 108 are provided so that at least parts thereof are in contact with the semiconductor layer 102. The conductive layer 105a and the conductive layer 105b may be formed inside enough that each of peripheries thereof does not reach peripheries of the layer 103 made of the second composite material and the layer 104 made of the first composite material. In other words, the conductive layer 105a and the conductive layer 105b are not in contact with the semiconductor layer 102, and the conductive layer 105a may be formed so that a width thereof (the length in a channel length direction) gets shorter than a width of the layer 103a made of the second composite material (the length in the channel length direction). In addition, the conductive layer 105b may also be formed so that a width thereof (the length in the channel length direction) gets shorter than a width of the layer 104b made of the first composite material (the length in the channel length direction).

Note that the other structure, material, and effect of the semiconductor element according to the present invention illustrated in FIG. 5A is the same as those in FIG. 1A; therefore, the illustration in FIG. 5A follows that in FIG. 1A and the repeated explanation will be omitted.

Figure 5B:
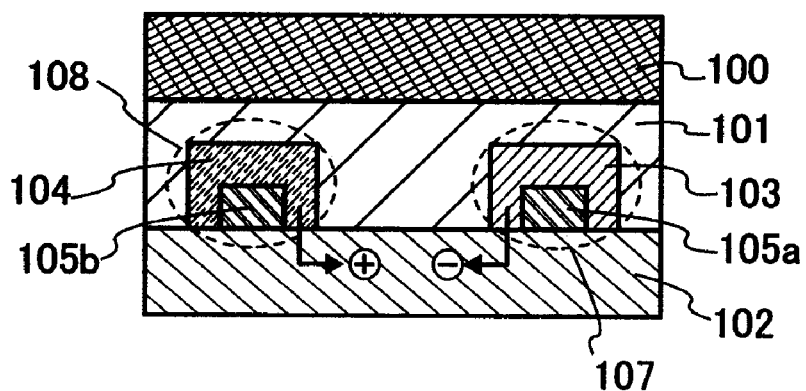

A semiconductor element according to the present invention having different structure is shown in FIG. 5B. The semiconductor element according to the present invention illustrated in FIG. 5B includes a first electrode 100, an insulating film 101, a semiconductor layer 102, a second electrode 107, and a third electrode 108.

The semiconductor layer 102 is formed over an arbitrary insulator such as an insulating substrate or an insulating film, which is not shown, and the insulating film 101 electrically insulates the first electrode 100 from the semiconductor layer 102, the second electrode 107, and the third electrode 108. The second electrode 107 and the third electrode 108 are formed over the semiconductor layer 102, and the insulating film 101 is formed to cover the semiconductor layer 102, the second electrode 107, and the third electrode 108.

In addition, the second electrode 107 is formed of two layers of a conductive layer 105a and a layer 103 made of a second composite material, and the third electrode 108 is formed of two layers of a conductive layer 105b and a layer 104 made of a first composite material, respectively. The layer 103 made of the second composite material in the second electrode 107 and the layer 104 made of the first composite material in the third electrode 108 are provided so that at least parts thereof are in contact with the semiconductor layer 102. The conductive layer 105a and the conductive layer 105b are formed inside enough that each of peripheries thereof does not reach peripheries of the layer 103 made of the second composite material and the layer 104 made of the first composite material. In other words, the semiconductor element in FIG. 5B is different from that in FIG. 5A, and the layer 103 made of the second composite material, the layer 104 made of the first composite material, the conductive layer 105a, and the conductive layer 105b are each formed so as to be in contact with the semiconductor layer 102. Therefore, the layer 103 made of the second composite material and the layer 104 made of the first composite material are formed so as to cover the surface of the conductive layer 105a and the conductive layer 105b, and the conductive layer 105a and the conductive layer 105b have a structure where the conductive layers are not in contact with the insulating film 101.

Note that the other structure, material, and effect of the semiconductor element according to the present invention illustrated in FIG. 5B is the same as those in FIG. 1A; therefore, the illustration in FIG. 5B follows that in FIG. 1A and the repeated explanation will be omitted.

Figure 5C:
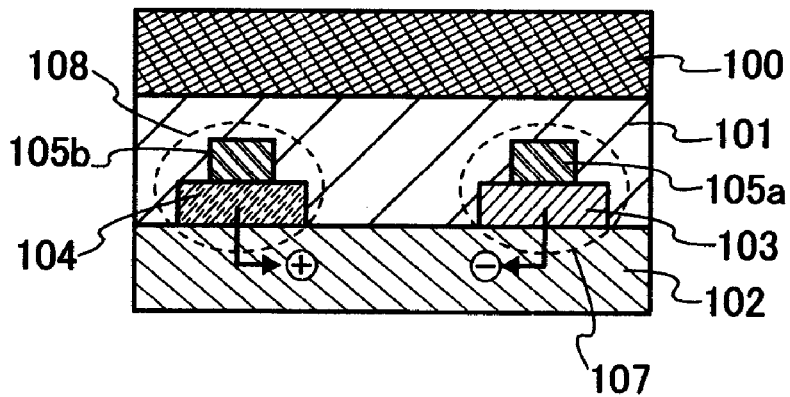

A semiconductor element according to the present invention having different structure is shown in FIG. 5C. The semiconductor element according to the present invention illustrated in FIG. 5C includes a first electrode 100, an insulating film 101, a semiconductor layer 102, a second electrode 107, and a third electrode 108.

The semiconductor layer 102 is formed over an arbitrary insulator such as an insulating substrate or an insulating film, which is not shown, and the insulating film 101 electrically insulates the first electrode 100 from the semiconductor layer 102, the second electrode 107, and the third electrode 108. The second electrode 107 and the third electrode 108 are formed over the semiconductor layer 102, and the insulating film 101 is formed to cover the semiconductor layer 102, the second electrode 107, and the third electrode 108.

In addition, the second electrode 107 is formed of two layers of a conductive layer 105a and a layer 103 made of a second composite material, and the third electrode 108 is formed of two layers of a conductive layer 105b and a layer 104 made of a first composite material, respectively. The layer 103 made of the second composite material in the second electrode 107 and the layer 104 made of the first composite material in the third electrode 108 are provided so that at least parts thereof are in contact with the semiconductor layer 102. The conductive layer 105a and the conductive layer 105b are formed inside enough that each of peripheries thereof does not reach peripheries of the layer 103 made of the second composite material and the layer 104 made of the first composite material, and the conductive layers are not in contact with the semiconductor layer 102. In other words, the conductive layer 105a and the conductive layer 105b are not in contact with the semiconductor layer 102, and the conductive layer 105a is formed so that a width thereof (the length in a channel length direction) gets shorter than a width of the layer 103a made of the second composite material (the length in the channel length direction). In addition, the conductive layer 105b is also formed so that a width thereof (the length in the channel length direction) gets shorter than a width of the layer 104b made of the first composite material (the length in the channel length direction).

In the case where the electrode is disposed over the semiconductor layer 102 as illustrated in FIGS. 5A to 5C, the surface of the semiconductor layer 102 is damaged by sputtering in forming the electrode; thus, a performance as a semiconductor element is deteriorated in some cases. However, in such a structure as FIG. 5C, the conductive layer 105a and the conductive layer 105b are formed inside enough that each of peripheries thereof does not reach peripheries of the layer 103 made of the second composite material and the layer 104 made of the first composite material, and the conductive layers are not in contact with the semiconductor layer 102. Therefore, it becomes possible to form a metal conductive layer without damaging the semiconductor layer 102. Specifically, the conductive layers may be formed only over the layers made of the composite materials with the use of a mask.

Note that the other structure, material, and effect of the semiconductor element according to the present invention illustrated in FIG. 5C is the same as those in FIG. 1A; therefore, the illustration in FIG. 5C follows that in FIG. 1A and the repeated explanation will be omitted.

Figure 6A:
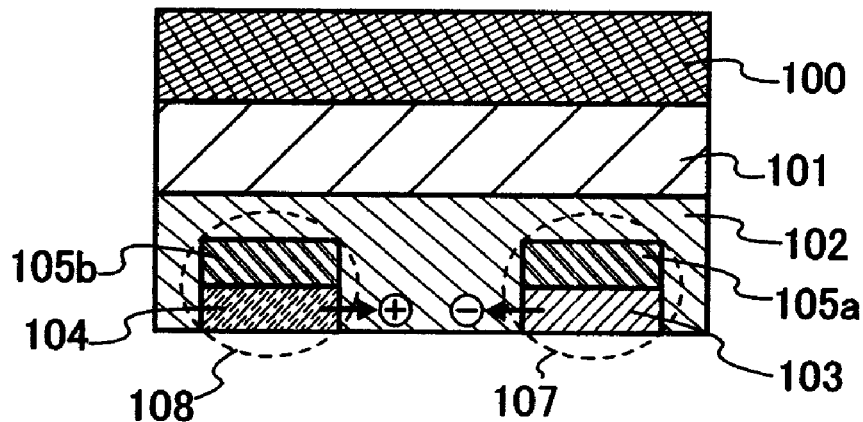
FIGS. 6A to 6C are each a schematic cross-sectional view of an organic light-emitting transistor according to the present invention.
Figure 6B:
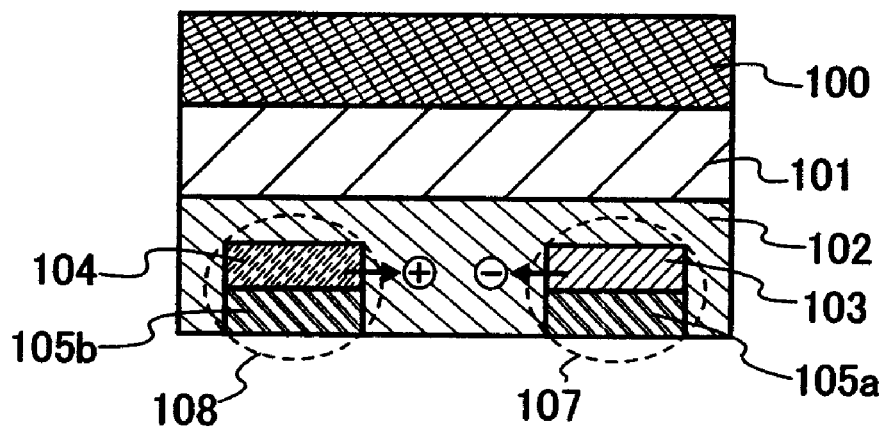

A semiconductor element according to the present invention having different structure is shown in FIG. 6B. The semiconductor element according to the present invention illustrated in FIG. 6B includes a first electrode 100, an insulating film 101, a semiconductor layer 102, a second electrode 107, and a third electrode 108.

The second electrode 107 and the third electrode 108 are formed over an arbitrary insulator such as an insulating substrate or an insulating film, which is not shown. The semiconductor layer 102 is formed to cover the second electrode 107 and the third electrode 108, and the insulating film 101 electrically insulates the first electrode 100 from the semiconductor layer 102.

In addition, the second electrode 107 is formed of two layers of a conductive layer 105a and a layer 103 made of a second composite material, and the third electrode 108 is formed of two layers of a conductive layer 105b and a layer 104 made of a first composite material, respectively. The layer 103 made of the second composite material in the second electrode 107 and the layer 104 made of the first composite material in the third electrode 108 are provided so that at least parts thereof are in contact with the semiconductor layer 102. The conductive layer 105a and the conductive layer 105b may be formed inside enough that each of peripheries thereof does not reach peripheries of the layer 103 made of the second composite material and the layer 104 made of the first composite material. In other words, the conductive layer 105a may be formed so that a width thereof (the length in a channel length direction) gets shorter than a width of the layer 103a made of the second composite material (the length in the channel length direction). In addition, the conductive layer 105b may also be formed so that a width thereof (the length in the channel length direction) gets shorter than a width of the layer 104b made of the first composite material (the length in the channel length direction).

In the second electrode 107 and the third electrode 108 in FIG. 6B, the layer 103 made of the second composite material and the layer 104 made of the first composite material are each formed closer to the first electrode 100, and the conductive layer 105a and the conductive layer 105b are formed far from the insulating film 101. However, as in FIG. 6A, the conductive layer 105a and the conductive layer 105b may be formed closer to the first electrode 100, and the layer 103 made of the second composite material and the layer 104 made of the first composite material may be formed far from the insulating film 101. In such a structure as FIG. 6B, an area where the semiconductor layer 102 and the layer 103 made of the second composite material are in contact with each other and an area where the layer 104 made of the first composite material and the semiconductor layer 102 are in contact with each other get larger; therefore, FIG. 6B is a structure advantage in injecting holes and electrons. The structure in FIG. 6B is the same as that in FIG. 6A other than the order of the stacked layer of the electrodes.

Note that the other structure, material, and effect of the semiconductor element according to the present invention illustrated in FIGS. 6A and 6B are the same as those in FIG. 1A; therefore, the illustration in FIGS. 6A and 6B follows that in FIG. 1A and the repeated explanation will be omitted.

Figure 6C:
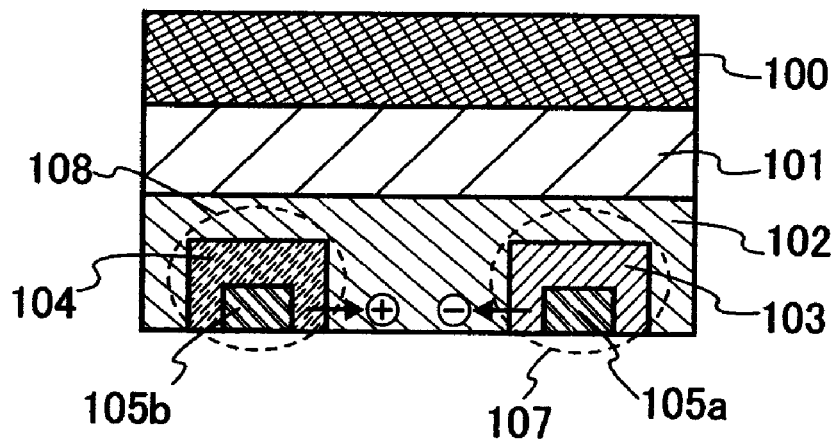

A semiconductor element according to the present invention having different structure is shown in FIG. 6C. The semiconductor element according to the present invention illustrated in FIG. 6C includes a first electrode 100, an insulating film 101, a semiconductor layer 102, a second electrode 107, and a third electrode 108.

The second electrode 107 and the third electrode 108 are formed over an arbitrary insulator such as an insulating substrate or an insulating film, which is not shown. The semiconductor layer 102 is formed to cover the second electrode 107 and the third electrode 108, and the insulating film 101 electrically insulates the first electrode 100 from the semiconductor layer 102.

In addition, the second electrode 107 is formed of two layers of a conductive layer 105*a* and a layer 103 made of a second composite material, and the third electrode 108 is formed of two layers of a conductive layer 105*b* and a layer 104 made of a first composite material, respectively. The layer 103 made of the second composite material in the second electrode 107 and the layer 104 made of the first composite material in the third electrode 108 are provided so that at least parts thereof are in contact with the semiconductor layer 102. The conductive layer 105*a* and the conductive layer 105*b* are formed inside enough that each of peripheries thereof does not reach peripheries of the layer 103 made of the second composite material and the layer 104 made of the first composite material. In other words, the layer 103 made of the second composite material and the layer 104 made of the first composite material in the semiconductor element in FIG. 6C are formed so as to cover the surface of the conductive layer 105*a* and the conductive layer 105*b*, and the conductive layer 105*a* and the conductive layer 105*b* have a structure where the conductive layers are not in contact with the semiconductor layer 102.

Note that the other structure, material, and effect of the semiconductor element according to the present invention illustrated in FIG. 6C is the same as those in FIG. 1A; therefore, the illustration in FIG. 6C follows that in FIG. 1A and the repeated explanation will be omitted.

Figure 7A:
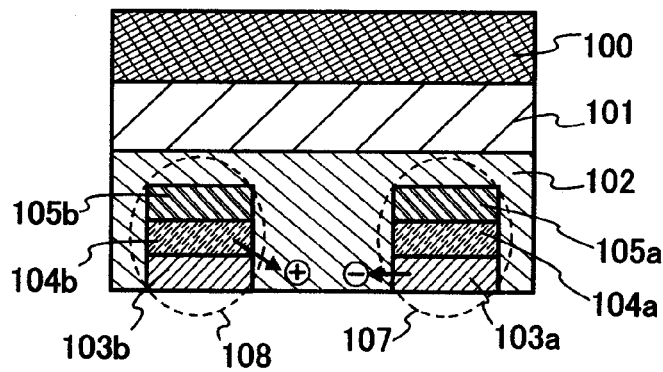
FIGS. 7A to 7D are each a schematic cross-sectional view of an organic light-emitting transistor according to the present invention.

A semiconductor element according to the present invention having different structure is shown in FIG. 7A. The semiconductor element according to the present invention illustrated in FIG. 7A includes a first electrode 100, an insulating film 101, a semiconductor layer 102, a second electrode 107, and a third electrode 108.

The second electrode 107 and the third electrode 108 are formed over an arbitrary insulator such as an insulating substrate or an insulating film, which is not shown. The semiconductor layer 102 is formed to cover the second electrode 107 and the third electrode 108, and the insulating film 101 electrically insulates the first electrode 100 from the semiconductor layer 102.

In addition, the second electrode 107 is formed of three layers of a conductive layer 105*a*, a layer 103*a* made of a second composite material, and a layer 104*a* made of a first composite material, and the third electrode 108 is formed of three layers of a conductive layer 105*b*, a layer 103*b* made of a second composite material, and a layer 104*b* made of a first composite material, respectively. The layer 103*a* made of the second composite material in the second electrode 107 and the layer 104*b* made of the first composite material in the third electrode 108 are provided so that at least parts thereof are in contact with the semiconductor layer 102. In addition, the layer 104*a* made of the first composite material and the layer 103*a* made of the second composite material in the second electrode 107 are provided so that at least parts thereof are in contact with each other, and the layer 104*b* made of the first composite material and the layer 103*b* made of the second composite material in the third electrode 108 are provided so that at least parts thereof are in contact with each other. The conductive layer 105*a* and the conductive layer 105*b* may be formed inside enough that each of peripheries thereof does not reach peripheries of the layers made of these composite materials. In other words, the conductive layer 105*a* may be formed so that a width thereof (the length in a channel length direction) gets shorter than a width of the layer 103*a* made of the second composite material and a width of the layer 104*a* made of the first composite material (the length in the channel length direction). In addition, the conductive layer 105*b* may also be formed so that a width thereof (the length in the channel length direction) gets shorter than a width of the layer 103*b* made of the second composite material and a width of the layer 104*b* made of the first composite material (the length in the channel length direction).

Note that the layers 103*a* and 103*b* made of the second composite materials can be formed with the material of the layer 103 made of the second composite material explained in FIG. 1A, and the layers 104*a* and 104*b* made of first composite materials can be formed with the material of the layer 104 made of the first composite material explained in FIG. 1A.

In the semiconductor element according to the present invention illustrated in FIG. 7A, the second electrode 107 and the third electrode 108 each have both the layer made of the second composite material and the layer made of the first composite material. Further, since the layer made of the second composite material and the layer made of the first composite material are in contact with each other, it becomes possible to improve injectability of electrons or holes and to reduce a drive voltage much more.

In addition, in the structure illustrated in FIG. 7A, it is possible to manufacture the second electrode 107 and the third electrode 108 by repeating deposition only three times with the same mask. Therefore, it is possible to obtain a semiconductor element that can be manufactured simply and easily much more. Note that the order of stacking the layer made of the first composite material and the layer made of the second composite material may be reversed.

Note that the other structure, material, and effect of the semiconductor element according to the present invention illustrated in FIG. 7A is the same as those in FIG. 1A; therefore, the illustration in FIG. 7A follows that in FIG. 1A and the repeated explanation will be omitted.

Figure 7B:
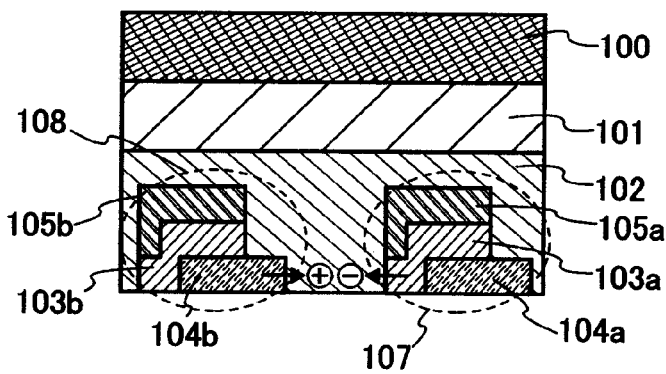

A semiconductor element according to the present invention having different structure is shown in FIG. 7B. The semiconductor element according to the present invention illustrated in FIG. 7B includes a first electrode 100, an insulating film 101, a semiconductor layer 102, a second electrode 107, and a third electrode 108.

The second electrode 107 and the third electrode 108 are formed over an arbitrary insulator such as an insulating substrate or an insulating film, which is not shown. The semiconductor layer 102 is formed to cover the second electrode 107 and the third electrode 108, and the insulating film 101 electrically insulates the first electrode 100 from the semiconductor layer 102.

In addition, the second electrode 107 is formed of three layers of a conductive layer 105a, a layer 103a made of a second composite material, and a layer 104a made of a first composite material, and the third electrode 108 is formed of three layers of a conductive layer 105b, a layer 103b made of a second composite material, and a layer 104b made of a first composite material, respectively. The layer 103a made of the second composite material in the second electrode 107 and the layer 104b made of the first composite material in the third electrode 108 are provided so that at least parts thereof are in contact with the semiconductor layer 102. In addition, the layer 104a made of the first composite material and the layer 103a made of the second composite material in the second electrode 107 are provided so that at least parts thereof are in contact with each other, and the layer 104b made of the first composite material and the layer 103b made of the second composite material in the third electrode 108 are provided so that at least parts thereof are in contact with each other. The conductive layer 105a and the conductive layer 105b may be formed inside enough that each of peripheries thereof does not reach peripheries of the layers made of these composite materials. In other words, the conductive layer 105a may be formed so that a width thereof (the length in a channel length direction) gets shorter than a width of the layer 103a made of the second composite material (the length in the channel length direction). In addition, the conductive layer 105b may also be formed so that a width thereof (the length in the channel length direction) gets shorter than a width of the layer 103b made of the second composite material (the length in the channel length direction).

Note that the layers 103a and 103b made of the second composite materials can be formed with the material of the layer 103 made of the second composite material explained in FIG. 1A, and the layers 104a and 104b made of first composite materials can be formed with the material of the layer 104 made of the first composite material explained in FIG. 1A.

In the semiconductor element according to the present invention illustrated in FIG. 7B, the second electrode 107 and the third electrode 108 each have both the layer made of the second composite material and the layer made of the first composite material. Further, since the layer made of the second composite material and the layer made of the first composite material are in contact with each other, it becomes possible to improve injectability of electrons or holes and to reduce a drive voltage much more. Note that, in the semiconductor element according to the present invention illustrated in FIG. 7B, a portion where the layer 103a made of the second composite material is in contact with the semiconductor layer 102 is placed closer to the third electrode 108 side than the layer 104a made of the first composite material in the second electrode 107 on the side for injecting electrons. In the third electrode 108 on the side for injecting holes, a portion where the layer 104b made of the first composite material is in contact with the semiconductor layer 102 is placed closer to the second electrode 107 side than the layer 103b made of the second composite material. Therefore, it is considered that recombination possibility or injection efficiency is improved, which is a preferable structure.

In addition, in the structure illustrated in FIG. 7B, it is possible to manufacture the second electrode 107 and the third electrode 108 only with the second layer and the third layer deposited by slightly moving the same mask after depositing the first layer, among the three layers of the second electrode 107 and the third electrode 108. Therefore, it is possible to obtain a semiconductor element that can be manufactured simply and easily much more. Note that the order of stacking the layer made of the first composite material and the layer made of the second composite material may be reversed. However, the shape of the second electrode 107 and the third electrode 108 are also reversed so that a portion where the layer 103a made of the second composite material is in contact with the semiconductor layer 102 is placed closer to the third electrode 108 side than the layer 104a made of the first composite material in the second electrode 107 on the side for injecting electrons, and, in the third electrode 108 on the side for injecting holes, a portion where the layer 104b made of the first composite material is in contact with the semiconductor layer 102 is placed closer to the second electrode 107 side than the layer 103b made of the second composite material.

Note that the other structure, material, and effect of the semiconductor element according to the present invention illustrated in FIG. 7B is the same as those in FIG. 1A; therefore, the illustration in FIG. 7B follows that in FIG. 1A and the repeated explanation will be omitted.

Figure 7C:
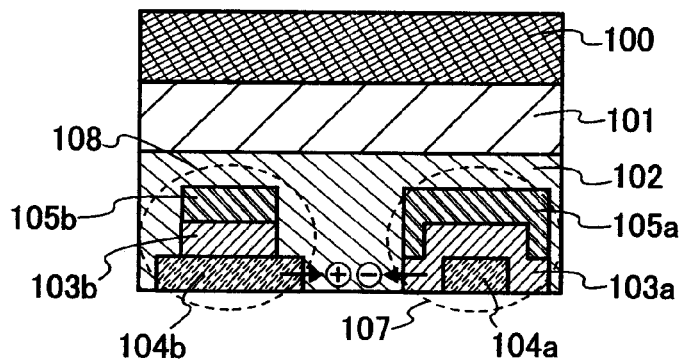

A semiconductor element according to the present invention having different structure is shown in FIG. 7C. The semiconductor element according to the present invention illustrated in FIG. 7C includes a first electrode 100, an insulating film 101, a semiconductor layer 102, a second electrode 107, and a third electrode 108.

The second electrode 107 and the third electrode 108 are formed over an arbitrary insulator such as an insulating substrate or an insulating film, which is not shown. The semiconductor layer 102 is formed to cover the second electrode 107 and the third electrode 108, and the insulating film 101 electrically insulates the first electrode 100 from the semiconductor layer 102.

In addition, the second electrode 107 is formed of three layers of a conductive layer 105a, a layer 103a made of a second composite material, and a layer 104a made of the first composite material, and the third electrode 108 is formed of three layers of a conductive layer 105b, a layer 103b made of a second composite material, and a layer 104b made of a first composite material, respectively. The layer 103a made of the second composite material in the second electrode 107 and the layer 104b made of the first composite material in the third electrode 108 are provided so that at least parts thereof are in contact with the semiconductor layer 102. In addition, the layer 104a made of the first composite material and the layer 103a made of the second composite material in the second electrode 107 are provided so that at least parts thereof are in contact with each other, and the layer 104b made of the first composite material and the layer 103b made of the second composite material in the third electrode 108 are provided so that at least parts thereof are in contact with each other. The conductive layer 105a and the conductive layer 105b may be formed inside enough that each of peripheries thereof does not reach peripheries of the layers made of these composite materials. In other words, the conductive layer 105a may be formed so that a width thereof (the length in a channel length direction) gets shorter than a width of the layer 103a made of the second composite material (the length in the channel length direction). In addition, the conductive layer 105b may also be formed so that a width thereof (the length in the channel length direction) gets shorter than a width of the layer 103*b* made of the second composite material (the length in the channel length direction).

Note that the layers 103*a* and 103*b* made of the second composite materials can be formed with the material of the layer 103 made of the second composite material explained in FIG. 1A, and the layers 104*a* and 104*b* made of first composite materials can be formed with the material of the layer 104 made of the first composite material explained in FIG. 1A.

In the semiconductor element according to the present invention illustrated in FIG. 7C, the second electrode 107 and the third electrode 108 each have both the layer made of the second composite material and the layer made of the first composite material. Further, since the layer made of the second composite material and the layer made of the first composite material are in contact with each other, it becomes possible to improve injectability of electrons or holes and to reduce a drive voltage much more. Note that, in the semiconductor element according to the present invention illustrated in FIG. 7B, a portion where the layer 103*a* made of the second composite material is in contact with the semiconductor layer 102 is placed closer to the third electrode 108 side than the layer 104*a* made of the first composite material in the second electrode 107 on the side for injecting electrons. In the third electrode 108 on the side for injecting holes, a portion where the layer 104*b* made of the first composite material is in contact with the semiconductor layer 102 is placed closer to the second electrode 107 side than the layer 103*b* made of the second composite material. Therefore, it is considered that recombination possibility or injection efficiency is improved, which is a preferable structure. Note that the order of stacking the layer made of the first composite material and the layer made of the second composite material may be reversed. However, the shape of the second electrode 107 and the third electrode 108 are also reversed so that a portion where the layer 103*a* made of the second composite material is in contact with the semiconductor layer 102 is placed closer to the third electrode 108 side than the layer 104*a* made of the first composite material in the second electrode 107 on the side for injecting electrons, and, in the third electrode 108 on the side for injecting holes, a portion where the layer 104*b* made of the first composite material is in contact with the semiconductor layer 102 is placed closer to the second electrode 107 side than the layer 103*b* made of the second composite material.

Figure 7D:
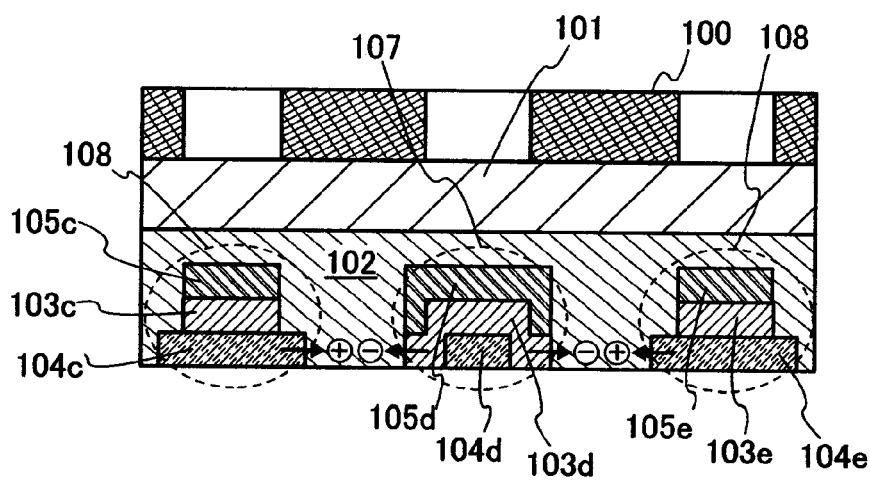

FIG. 7D, having a comb-shape electrode as shown in FIG. 4, is an application example of FIG. 7C and an example of applying the semiconductor element the shape of which is in FIG. 7C in a case of a structure where many semiconductor elements are connected. FIG. 7D corresponds to a cross-sectional view taken along α-β in FIG. 4. In this structure, the third electrode 108 exists on the both sides of the second electrode 107 and light emission can be obtained through the semiconductor layer 102 on either side. In addition, except the first electrode 100, light emission can be controlled separately. Of course, the first electrode 100 may be identical. Moreover, although not shown, the third electrode 108 is provided on the both sides of the second electrode 107, and FIG. 7D is a structure where such a structure is provided repeatedly.

Note that the other structure, material, and effect of the semiconductor element according to the present invention illustrated in FIG. 7C is the same as those in FIG. 1A; therefore, the illustration in FIG. 7C follows that in FIG. 1A and the repeated explanation will be omitted.

A semiconductor element according to the present invention having different structure is shown in FIGS. 8A to 8D. The semiconductor element according to the present invention illustrated in FIGS. 8A to 8D includes a first electrode 100, an insulating film 101, a semiconductor layer 102, a second electrode 107, and a third electrode 108.

In the structures of FIGS. 8A to 8D, the structures of FIGS. 8A to 8D are almost the same as those of FIG. 1A, FIG. 2A, FIG. 5A, and FIG. 6A, respectively. However, the second electrode 107 has a three-layer structure of a layer 103 made of a second composite material, a layer 104*a* made of a first composite material, and a conductive layer 105*a*. FIGS. 8A to 8D differ from FIG. 1A, FIG. 2A, FIG. 5A, and FIG. 6A, respectively, in that the layer 103 made of the second composite material and the layer 104*a* made of the first composite material are in contact with each other.

In the second electrode 107, a stacked layer structure of the layer 103 made of the second composite material and the layer 104*a* made of the first composite material is included. Therefore, it is possible to obtain a semiconductor element in which electrons are easily injected into the semiconductor layer 102 from the layer 103 made of the second composite material and a drive voltage is decreased much more.

Note that, in FIGS. 8A to 8D, only drawings corresponding to FIG. 1A, FIG. 2A, FIG. 5A, and FIG. 6A are shown; however, the structures in FIGS. 8A to 8D can be appropriately applied to the semiconductor element according to the present invention each illustrated in FIGS. 1A to 1C, FIGS. 2A to 2C, FIGS. 5A to 5C, and FIGS. 6A to 6C.

Note that the other structure, material, and effect of the semiconductor element according to the present invention illustrated in FIGS. 8A to 8D are the same as those in FIG. 1A; therefore, the illustration in FIGS. 8A to 8D follows that in FIG. 1A and the repeated explanation will be omitted.

Each of the semiconductor elements in FIGS. 1A to 1C, FIGS. 2A to 2C, FIGS. 3A to 3D, FIG. 4, FIGS. 5A to 5C, FIGS. 6A to 6C, FIGS. 7A to 7D, and FIGS. 8A to 8D is an organic transistor where the first electrode 100 is a gate electrode, one of the second electrode 107 and the third electrode 108 is a source electrode, and the other is a drain electrode. In addition, since light emission can be obtained through the semiconductor layer 102, the semiconductor element can also be referred to as an organic light-emitting transistor.

Which of an electron and a hole is a main carrier determines whether this organic transistor or organic light-emitting transistor is a p-type transistor or an n-channel transistor. Therefore, in a case of a p-type organic transistor or organic light-emitting transistor according to the present invention, of the second electrode 107 and the third electrode 108, the electrode for applying higher voltage is referred to as a source electrode and the other electrode for applying lower voltage is referred to as a drain electrode in driving the electrodes. In a case of an n-type organic transistor or organic light-emitting transistor according to the present invention, of the second electrode 107 and the third electrode 108, the electrode for applying lower voltage is referred to as a source electrode and the other electrode for applying higher voltage is referred to as a drain electrode in driving the electrodes.

The p-type organic transistor or organic light-emitting transistor has a structure where the source electrode at least includes a layer made of a first composite material and the layer made of the first composite material in the source electrode is in contact with the semiconductor layer 102, and the drain electrode at least includes a layer made of a second composite material and the layer made of the second composite material in the drain electrode is in contact with the semiconductor layer 102. In addition, the n-type organic transistor or organic light-emitting transistor has a structure where the source electrode at least includes a layer made of a second composite material and the layer made of the second composite material in the source electrode is in contact with the semiconductor layer 102, and the drain electrode at least includes a layer made of a first composite material and the layer made of the first composite material in the drain electrode is in contact with the semiconductor layer 102.

Embodiment Mode 2

A semiconductor element according to the present invention having a structure different from those in FIGS. 1A to 1C, FIGS. 2A to 2C, FIGS. 3A to 3D, FIGS. 5A to 5C, FIGS. 6A to 6C, FIGS. 7A to 7D, and FIGS. 8A to 8D will be explained with reference to FIGS. 9A to 9C, FIGS. 10A to 10C, FIGS. 11A to 11C, and FIGS. 12A to 12C.

Figure 8A:
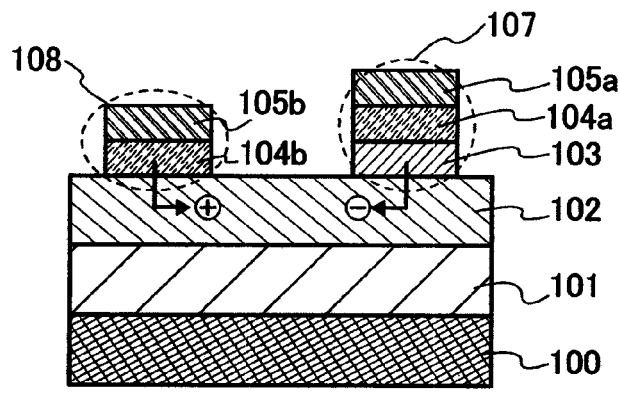
FIGS. 8A to 8D are each a schematic cross-sectional view of an organic light-emitting transistor according to the present invention.
Figure 8B:
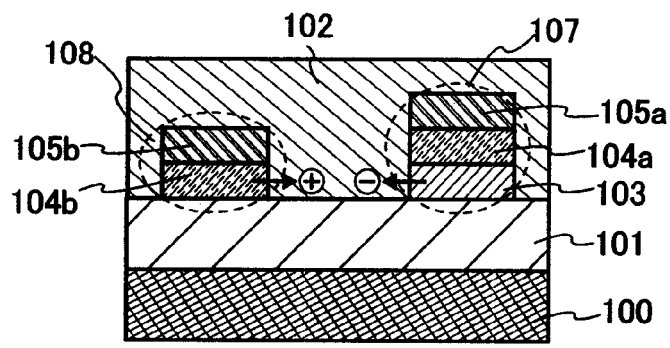
Figure 8C:
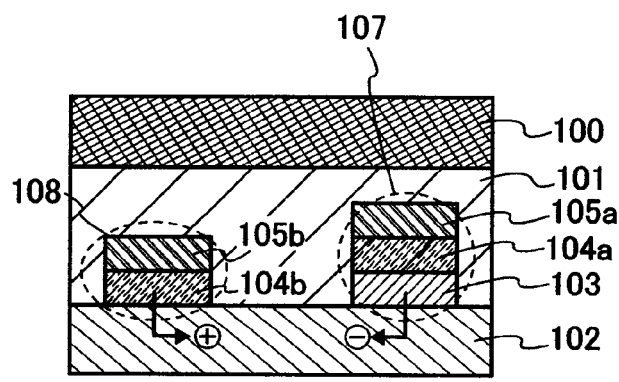
Figure 9A:
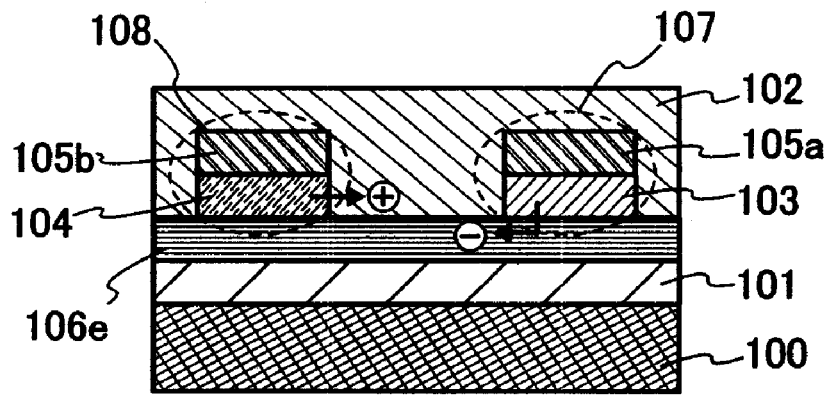
FIGS. 9A to 9C are each a schematic cross-sectional view of an organic light-emitting transistor according to the present invention.
Figure 9B:
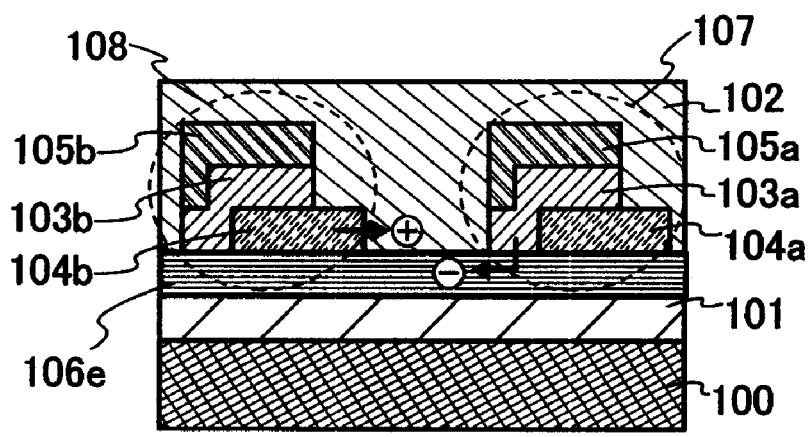
Figure 9C:
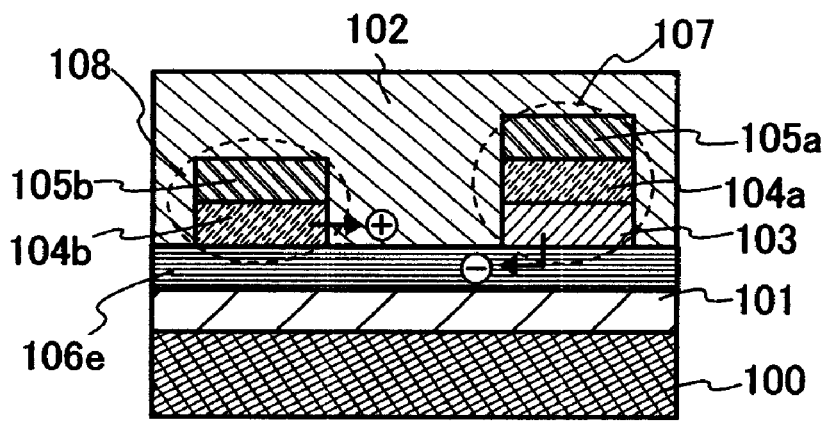

A semiconductor element according to the present invention each shown in FIGS. 9A to 9C includes a first electrode 100, an insulating film 101, a layer 106e having an electron-transporting property, a second electrode 107, a third electrode 108, and a semiconductor layer 102 and, in the basic structure, FIG. 9A, FIG. 9B, and FIG. 9C correspond to FIG. 2A, FIG. 3B, and FIG. 8B, respectively. The different portion in each corresponding structure is that the layer 106e having an electron-transporting property is formed between the insulating film 101 and each of the second electrode 107, the third electrode 108, and the semiconductor layer 102.

In any of structures in FIGS. 9A to 9C, in the second electrode 107, a layer 103 or 103a made of a second composite material is formed to be in contact at least with the layer 106e having an electron-transporting property, and, in the third electrode 108, a layer 104 or 104b made of a first composite material is formed to be in contact at least with the semiconductor layer 102.

In the semiconductor elements according to the present invention having such a structure, electrons are injected into the layer 106e having an electron-transporting property from the second electrode 107 and holes are injected into the semiconductor layer 102 from the third electrode 108 when voltage above a certain level is applied between the second electrode 107 and the third electrode 108 so that the voltage of the third electrode 108 gets higher. By having such a structure, electrons are injected into the layer 106e having an electron-transporting property even when the electron-transporting property of the semiconductor layer 102 is small. Therefore, further, it is also possible to improve injectability or transportability of holes and electrons and to reduce a drive voltage. The molecules of the semiconductor layer 102 are excited as a result of recombining the injected electrons and holes, and light emission can be obtained upon the excited molecules returning to a ground state.

As the material of the layer 106e having an electron-transporting property, the following material having a comparatively high electron-transporting property is used: a metal complex such as tris(8-quinolinolato)aluminum (abbreviation: Alq$_3$); tris(4-methyl-8-quinolinolato)aluminum (abbreviation: Almq$_3$); bis(10-hydroxybenzo[h]-quinolinato)beryllium (abbreviation: BeBq$_2$); bis(2-methyl-8-quinolinolato)-4-phenylphenolato-aluminum (abbreviation: BAlq); bis[2-(2-hydroxyphenyl)pyridinato]zinc (abbreviation: Znpp$_2$); bis[2-(2-hydroxyphenyl)benzoxazolato]zinc (abbreviation: Zn(BOX)$_2$); or bis[2-(2-hydroxyphenyl)benzothiazolato] zinc (abbreviation: Zn(BTZ)$_2$), an oxadiazole derivative such as 2-(4-biphenylyl)-5-(4-tert-buthylphenyl)-1,3,4-oxadiazole (abbreviation: PBD) or 1,3-bis[5-(p-tert-buthylphenyl)-1,3,4-oxadiazol-2-yl]benzene (abbreviation: OXD-7), a triazole derivative such as 3-(4-biphenylyl)-4-phenyl-5-(4-tert-buthylphenyl)-1,2,4-triazole (abbreviation: TAZ) or 3-(4-biphenylyl)-4-(4-ethylpheyl)-5-(4-tert-buthylphenyl)-1,2,4-triazole (abbreviation: p-EtTAZ), bathophenanthroline (abbreviation: BPhen), bathocuproin (abbreviation: BCP), 2,2',2"-(1,3,5-benzenetriyl)-tris(1-phenyl-1H-benzimidazole) (abbreviation: TPBI), 4,4-bis(5-methylbenzoxazol-2-yl)stilbene (abbreviation: BzOs), or the like. In the structures of FIGS. 9A to 9C, the materials described in Embodiment Mode 1 can be used as the material of the semiconductor layer 102; however, the structures in FIGS. 9A to 9C are effective especially when the material having a hole-transporting property is used as a material generally said as a p-type semiconductor or a host material. Note that, in order to recombine holes and electrons easily, it is desirable to select as small as possible the combination of an energy barrier of the layer 106e having an electron-transporting property and the semiconductor layer 102.

The other structures and effects thereof in FIG. 9A, FIG. 9B, and FIG. 9C are the same as those in FIG. 2A, FIG. 3B, and FIG. 8B, respectively; therefore, the repeated explanation will be omitted. Refer to the explanation of each corresponding drawing. Note that, although only FIG. 2A in FIGS. 2A to 2C and only FIG. 3B in FIG. 3A to 3D are given as an example for explanation, it is possible to apply the structures of FIGS. 9A to 9C to FIG. 2B, FIG. 3C, and FIG. 3D.

Figure 10A:
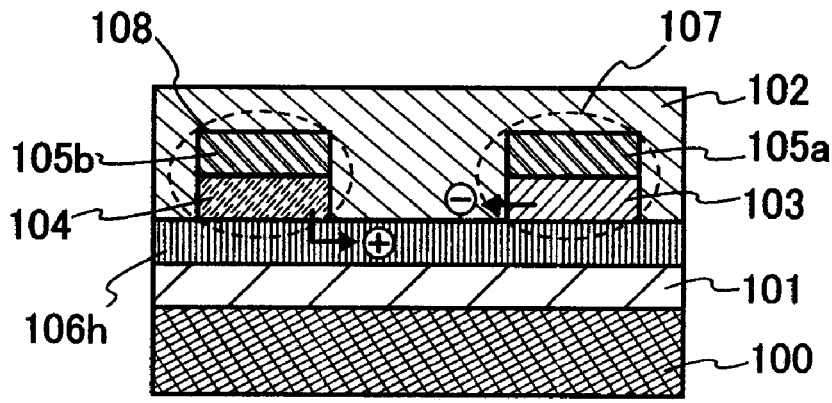
FIGS. 10A to 10C are each a schematic cross-sectional view of an organic light-emitting transistor according to the present invention.
Figure 10B:
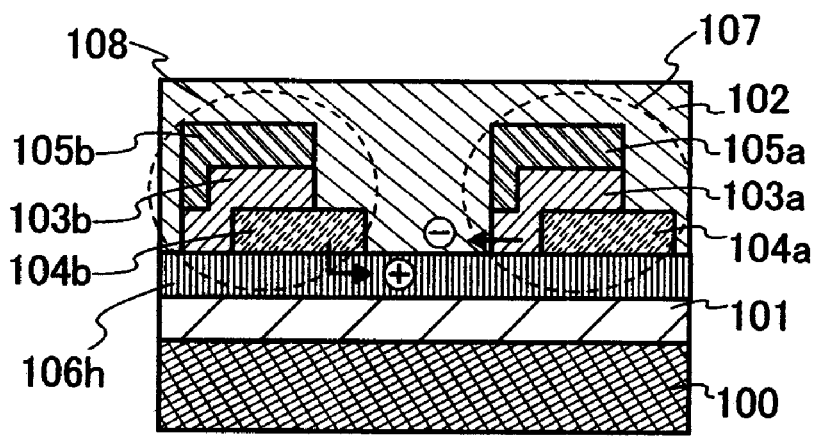
Figure 10C:
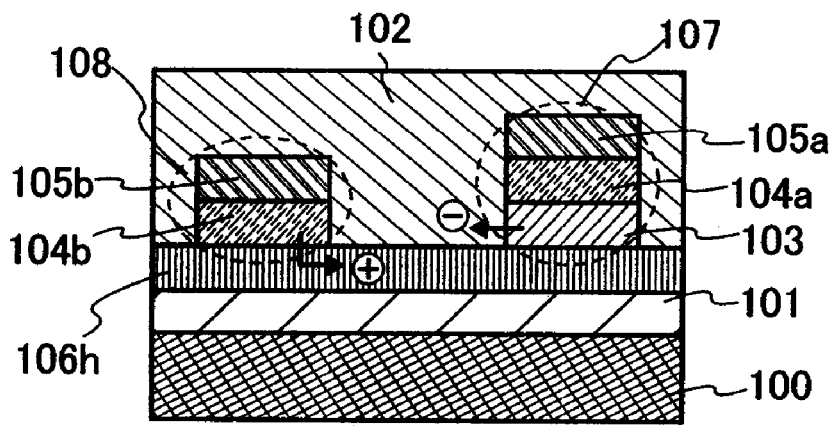

A semiconductor element according to the present invention each shown in FIGS. 10A to 10C includes a first electrode 100, an insulating film 101, a layer 106h having a hole-transporting property, a second electrode 107, a third electrode 108, and a semiconductor layer 102 and, in the basic structure, FIGS. 10A, 10B, and 10C correspond to FIG. 2A, FIG. 3B, and FIG. 8B, respectively. The different portion in each corresponding structure is that the layer 106h having a hole-transporting property is formed between the insulating film 101 and each of the second electrode 107, the third electrode 108, and the semiconductor layer 102.

In any of structures in FIGS. 10A to 10C, in the second electrode 107, a layer 103 or 103a made of a second composite material is formed to be in contact at least with the semiconductor layer 102, and, in the third electrode 108, a layer 104 or 104b made of a first composite material is formed to be in contact at least with the layer 106h having a hole-transporting property.

In the semiconductor elements according to the present invention having such a structure, electrons are injected into the semiconductor layer 102 from the second electrode 107 and holes are injected into the layer 106h having a hole-transporting property from the third electrode 108 when voltage above a certain level is applied between the second electrode 107 and the third electrode 108 so that the voltage of the third electrode 108 gets higher. By having such a structure, light emission can be obtained without applying a large electric field even when the hole-transporting property of the semiconductor layer 102 is small. In addition, since injectability or transportability of holes and electrons can also be improved, it also becomes possible to reduce a drive voltage. The molecules of the semiconductor layer 102 are excited as a result of recombining the injected electrons and holes, and light emission can be obtained upon the excited molecules returning to a ground state.

As the material of the layer 106h having a hole-transporting property, the following material having a comparatively high hole-transporting property is used: 4,4'-bis[N-(1-naphthyl)-N-phenylamino]biphenyl (abbreviation: NPB), 4,4'-bis[N-(3-methylphenyl)-N-phenylamino]biphenyl (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis{N-[4-(N,N-di-m-tolylamino)phenyl]-N- phenylamino}biphenyl (abbreviation: DNTPD), 1,3,5-tris [N,N-di(m-tolyl)amino]benzene (abbreviation: m-MTDAB), 4,4',4"-tris(N-carbazolyl)triphenylamine (abbreviation: TCTA), phthalocyanine (abbreviation: $H_2PC$), copper phthalocyanine (CuPc), vanadyl phthalocyanine (abbreviation: VOPc), or the like. In the structures of FIGS. 10A to 10C, the materials described in Embodiment Mode 1 can be used as the material of the semiconductor layer 102; however, the structures in FIGS. 10A to 10C are effective especially when the material having an electron-transporting property is used as a material generally said as a p-type semiconductor or a host material. Note that, in order to recombine holes and electrons easily, it is desirable to select as small as possible the combination of an energy barrier of the layer 106h having a hole-transporting property and the semiconductor layer 102.

The other structures and effects thereof in FIG. 10A, FIG. 10B, and FIG. 10C are the same as those in FIG. 2A, FIG. 3B, and FIG. 8B, respectively; therefore, the repeated explanation will be omitted. Refer to the explanation of each corresponding drawing. Note that, although only FIG. 2A in FIGS. 2A to 2C and only FIG. 3B in FIG. 3A to 3D are given as an example for explanation, it is possible to apply the structures of FIGS. 10A to 10C to FIG. 2B, FIG. 3C, and FIG. 3D.

Figure 8D:
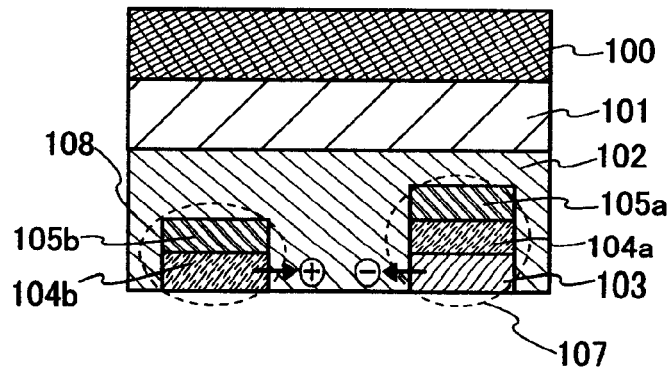
Figure 11A:
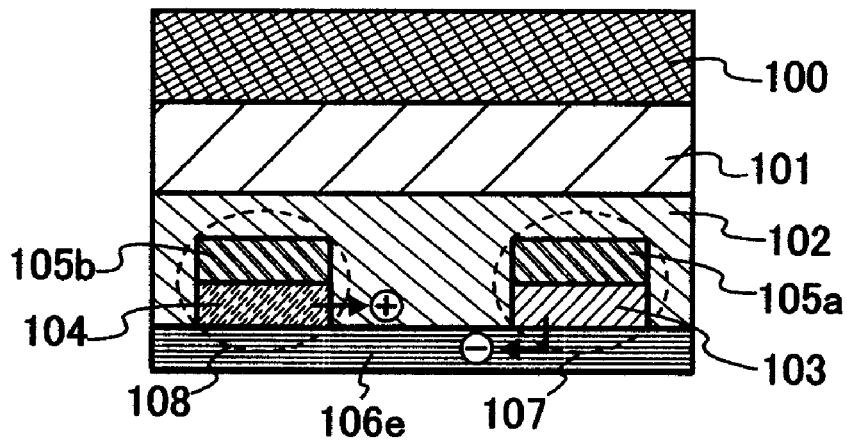
FIGS. 11A to 11C are each a schematic cross-sectional view of an organic light-emitting transistor according to the present invention.
Figure 11B:
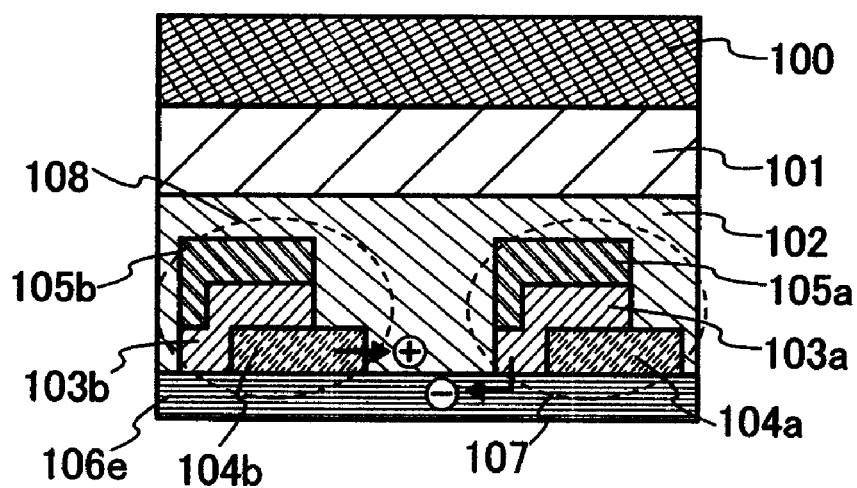
Figure 11C:
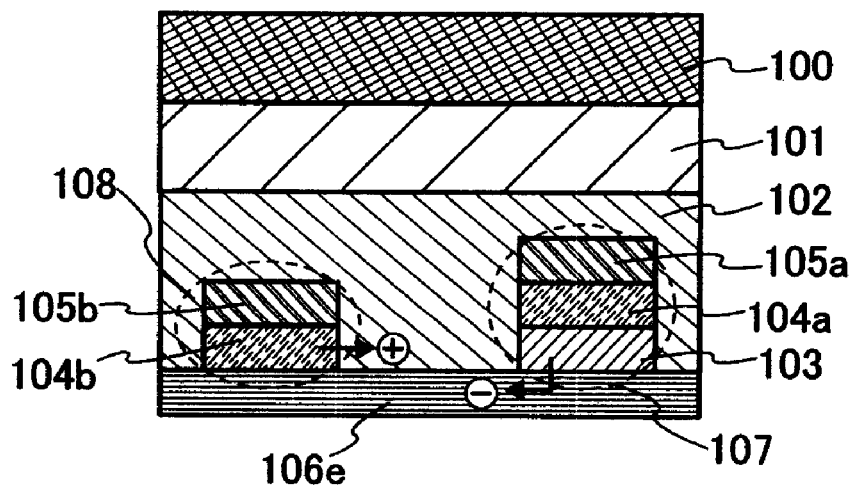

A semiconductor element according to the present invention each shown in FIGS. 11A to 11C includes a first electrode 100, an insulating film 101, a layer 106e having an electron-transporting property, a second electrode 107, a third electrode 108, and a semiconductor layer 102 and, in the basic structure, FIGS. 11A, 11B, and 11C correspond to FIG. 6A, FIG. 7B, and FIG. 8D, respectively. The different portion in each corresponding structure is that the layer 106e having an electron-transporting property is formed to be in contact with each of the second electrode 107, the third electrode 108, and the semiconductor layer 102.

In any of structures in FIGS. 11A to 11C, in the second electrode 107, a layer 103 or 103a made of a second composite material is formed to be in contact at least with the layer 106e having an electron-transporting property, and, in the third electrode 108, a layer 104 or 104b made of a first composite material is formed to be in contact at least with the semiconductor layer 102.

In the semiconductor elements according to the present invention having such a structure, electrons are injected into the layer 106e having an electron-transporting property from the second electrode 107 and holes are injected into the semiconductor layer 102 from the third electrode 108 when voltage above a certain level is applied between the second electrode 107 and the third electrode 108 so that the voltage of the third electrode 108 gets higher. Since injectability or transportability of holes and electrons can be improved by having such a structure, it also becomes possible to reduce a drive voltage. In addition, the molecules of the semiconductor layer 102 are excited as a result of recombining the injected electrons and holes, and light emission can be obtained upon the excited molecules returning to a ground state. In such a structure, light emission can be obtained without applying a large electric field even when the electron-transporting property of the semiconductor layer 102 is small.

As the material of the layer 106e having an electron-transporting property, the following material having a comparatively high electron-transporting property is used: a metal complex such as tris(8-quinolinolato)aluminum (abbreviation: $Alq_3$); tris(4-methyl-8-quinolinolato)aluminum (abbreviation: $Almq_3$); bis(10-hydroxybenzo[h]-quinolinato)beryllium (abbreviation: $BeBq_2$); bis(2-methyl-8-quinolinolato)-4-phenylphenolato-aluminum (abbreviation: BAlq); bis[2-(2-hydroxyphenyl)pyridinato]zinc (abbreviation: $Znpp_2$); bis [2-(2-hydroxyphenyl)benzoxazolato]zinc (abbreviation: $Zn(BOX)_2$); or bis[2-(2-hydroxyphenyl)benzothiazolato] zinc (abbreviation: $Zn(BTZ)_2$), an oxadiazole derivative such as 2-(4-biphenylyl)-5-(4-tert-buthylphenyl)-1,3,4-oxadiazole (abbreviation: PBD) or 1,3-bis[5-(p-tert-buthylphenyl)-1, 3,4-oxadiazol-2-yl]benzene (abbreviation: OXD-7), a triazole derivative such as 3-(4-biphenylyl)-4-phenyl-5-(4-tert-buthylphenyl)-1,2,4-triazole (abbreviation: TAZ) or 3-(4-biphenylyl)-4-(4-ethylpheyl)-5-(4-tert-buthylphenyl)-1,2,4-triazole (abbreviation: p-EtTAZ), bathophenanthroline (abbreviation: BPhen), bathocuproin (abbreviation: BCP), 2,2',2"-(1,3,5-benzenetriyl)-tris(1-phenyl-1H-benzimidazole) (abbreviation: TPBI), 4,4-bis(5-methylbenzoxazol-2-yl)stilbene (abbreviation: BzOs), or the like. In the structures of FIGS. 11A to 11C, the materials described in Embodiment Mode 1 can be used as the material of the semiconductor layer 102; however, the structures in FIGS. 11A to 11C are effective especially when the material having a hole-transporting property is used as a material generally said as a p-type semiconductor or a host material. Note that, in order to recombine holes and electrons easily, it is desirable to select as small as possible the combination of an energy barrier of the layer 106e having an electron-transporting property and the semiconductor layer 102.

The other structures and effects thereof in FIGS. 11A, 11B, and 11C are the same as those in FIG. 6A, FIG. 7B, and FIG. 8D, respectively; therefore, the repeated explanation will be omitted. Refer to the explanation of each corresponding drawing. Note that, although only FIG. 6A in FIGS. 6A to 6C and only FIG. 7B in FIG. 7A to 7D are given as an example for explanation, it is possible to apply the structures of FIGS. 11A to 11C to FIG. 6B, FIG. 7C, and FIG. 7D.

Figure 12A:
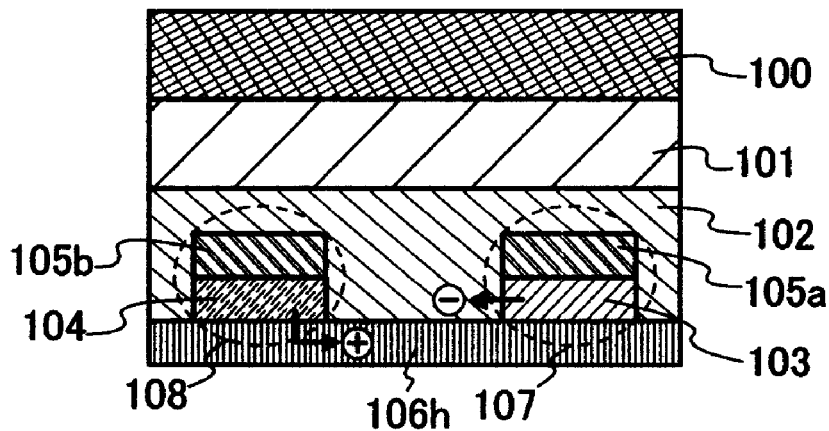
FIGS. 12A to 12C are each a schematic cross-sectional view of an organic light-emitting transistor according to the present invention.
Figure 12B:
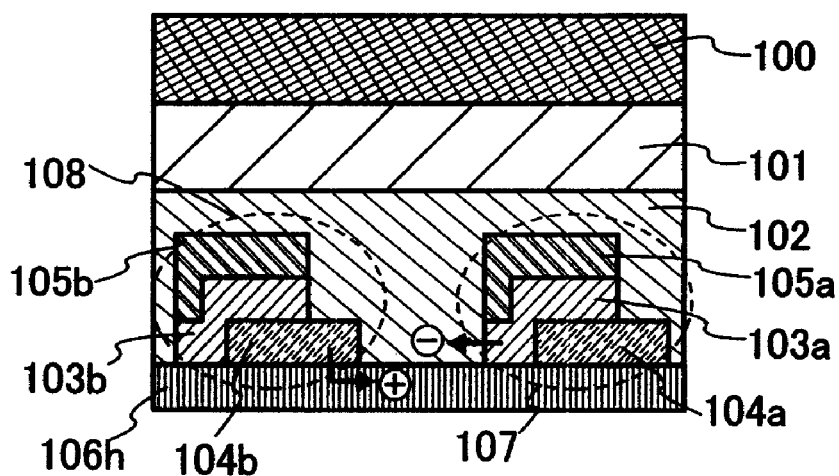
Figure 12C:
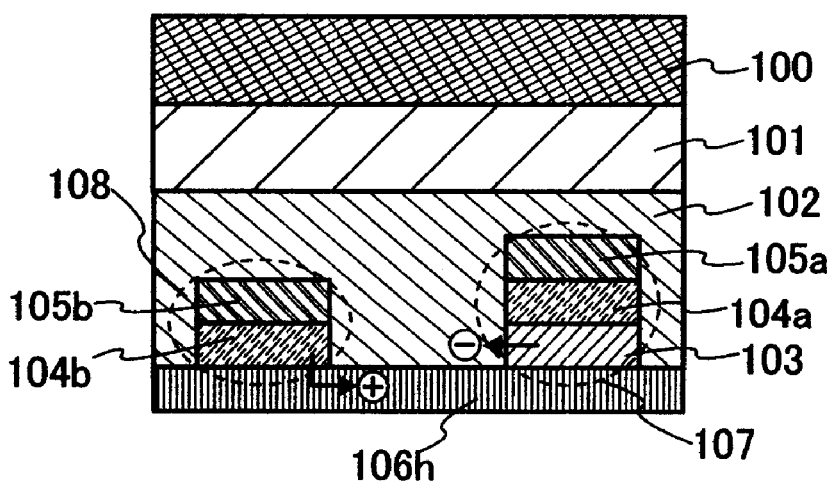
Figure 13A:
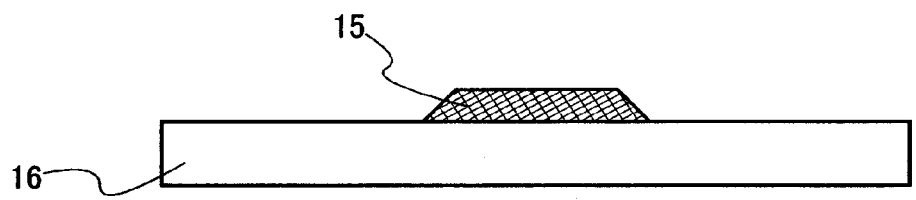
FIGS. 13A to 13E are views each showing a manufacturing method of an organic light-emitting transistor according to the present invention.
Figure 13B:
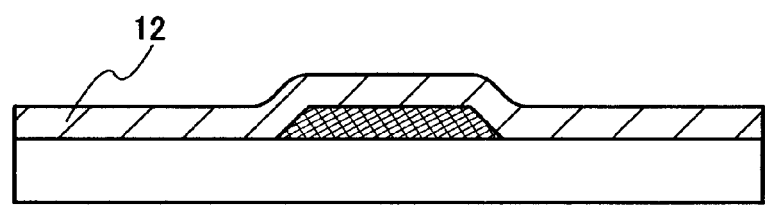
Figure 13C:
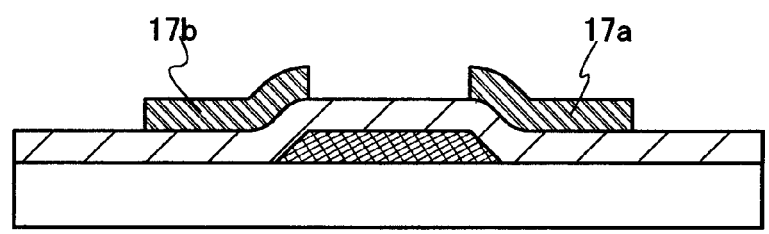
Figure 13D:
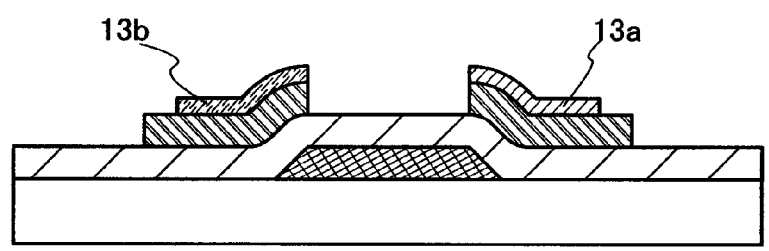
Figure 13E:
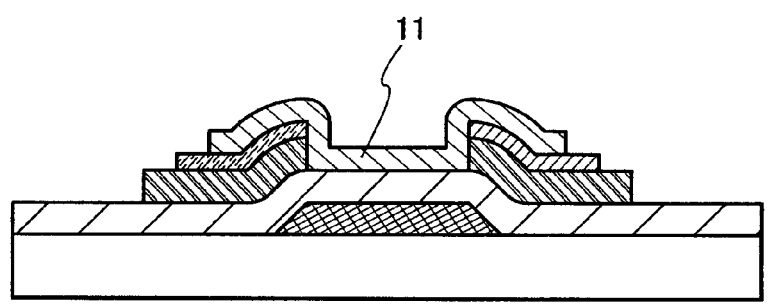

A semiconductor element according to the present invention each shown in FIGS. 12A to 12C includes a first electrode 100, an insulating film 101, a layer 106h having a hole-transporting property, a second electrode 107, a third electrode 108, and a semiconductor layer 102 and, in the basic structure, FIGS. 12A, 12B, and 12C correspond to FIG. 6A, FIG. 7B, and FIG. 8D, respectively. The different portion in each corresponding structure is that the layer 106h having a hole-transporting property is formed to be in contact with each of the second electrode 107, the third electrode 108, and the semiconductor layer 102.

In any of structures in FIGS. 12A to 12C, in the second electrode 107, a layer 103 or 103a made of a second composite material is formed to be in contact at least with the semiconductor layer 102, and, in the third electrode 108, a layer 104 or 104b made of a first composite material is formed to be in contact at least with the layer 106h having a hole-transporting property.

In the semiconductor elements according to the present invention having such a structure, electrons are injected into the semiconductor layer 102 from the second electrode 107 and holes are injected into the layer 106h having a hole-transporting property from the third electrode 108 when voltage above a certain level is applied between the second electrode 107 and the third electrode 108 so that the voltage of the third electrode 108 gets higher. Since injectability or transportability of holes and electrons can be improved by having such a structure, it also becomes possible to reduce a drive voltage. In addition, the molecules of the semiconductor layer 102 are excited as a result of recombining the injected electrons and holes, and light emission can be obtained upon the excited molecules returning to a ground state. In such a structure, light emission can be obtained without applying a large electric field even when the hole-transporting property of the semiconductor layer 102 is small.

As the material of the layer 106*h* having a hole-transporting property, the following material having a comparatively high hole-transporting property is used: 4,4'-bis[N-(1-naphthyl)-N-phenylamino]biphenyl (abbreviation: NPB), 4,4'-bis[N-(3-methylphenyl)-N-phenylamino]biphenyl (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis{N-[4-(N,N-di-m-tolylamino)phenyl]-N-phenylamino}biphenyl (abbreviation: DNTPD), 1,3,5-tris[N,N-di(m-tolyl)amino]benzene (abbreviation: m-MTDAB), 4,4',4''-tris(N-carbazolyl)triphenylamine (abbreviation: TCTA), phthalocyanine (abbreviation: $H_2Pc$), copper phthalocyanine (CuPc), vanadyl phthalocyanine (abbreviation: VOPc), or the like. In the structures of FIGS. 12A to 12C, the materials described in Embodiment Mode 1 can be used as the material of the semiconductor layer 102; however, the structures in FIGS. 12A to 12C are effective especially when the material having an electron-transporting property is used as a material generally said as a p-type semiconductor or a host material. Note that, in order to recombine holes and electrons easily, it is desirable to select as small as possible the combination of an energy barrier of the layer 106*h* having a hole-transporting property and the semiconductor layer 102.

The other structures and effects thereof in FIGS. 12A, 12B, and 12C are the same as those in FIG. 6A, FIG. 7B, and FIG. 8D, respectively; therefore, the repeated explanation will be omitted. Refer to the explanation of each corresponding drawing. Note that, although only FIG. 6A in FIGS. 6A to 6C and only FIG. 7B in FIG. 7A to 7D are given as an example for explanation, it is possible to apply the structures of FIGS. 12A to 12C to FIG. 6B, FIG. 7C, and FIG. 7D.

Embodiment Mode 3

A method for manufacturing a semiconductor element according to the present invention will be explained with reference to FIGS. 13A to 13E by giving FIG. 2C as an example.

First, a first electrode 15 made of tungsten is deposited over a quartz substrate 16 in 100 nm thick, an insulating film 12 made of silicon dioxide ($SiO_2$) is deposited over the first electrode 15 in 100 nm thick, and conductive layers 17*a* and 17*b* made of tungsten are deposited over the insulating film 12. After depositing tungsten over an entire surface of the substrate by a sputtering method or the like, a mask is formed by photolithography, and the first electrode 15 is etched in a desired shape. Either wet etching or dry etching may be used for the etching. The insulating film 12 is formed by a CVD method. In addition, the conductive layers 17*a* and 17*b* may be formed in the same manner as the first electrode 15. Moreover, over the conductive layer 17*a*, a layer 13*a* made of a second composite material is deposited in 10 nm thick by co-evaporating Alq and lithium, using a mask, by vacuum vapor deposition using resistance heating, such that a molar ratio between Alq and lithium is 1:0.01. Over the conductive layer 17*b*, a layer 13*b* made of a first composite material is deposited in 10 nm thick by co-evaporating molybdenum oxide and NPB, using a mask, by vacuum vapor deposition using resistance heating, such that a molar ratio between molybdenum oxide and NPB is 1:1. Accordingly, a second electrode including the conductive layer 17*a* and the layer 13*a* made of the second composite material and a third electrode including the conductive layer 17*b* and the layer 13*b* made of the first composite material are formed. Thereafter, pentacene is deposited as a semiconductor layer 11 between the second electrode and the third electrode by vapor deposition; thus, a semiconductor element according to the present invention can be manufactured. The semiconductor layer 11 is preferably vapor-deposited with a mask.

A method for manufacturing a semiconductor element according to the present invention each illustrated in FIGS. 1A to 1C, FIGS. 2A and 2B, FIGS. 3A to 3D, FIGS. 5A to 5C, FIGS. 6A to 6C, FIGS. 7A to 7D, and FIGS. 8A to 8D basically does not have large difference except that the above manufacturing order and the shape of the mask are changed. Note that, in the case where a conductive layer is formed over the semiconductor layer 11 as the structures illustrated in FIG. 1B and FIG. 5B, the semiconductor layer 11 is less damaged if gold is vapor-deposited by vacuum vapor deposition using a mask.

Note that the semiconductor element according to the present invention each illustrated in FIGS. 9A to 9C, FIGS. 10A to 10C, FIGS. 11A to 11C, and FIGS. 12A to 12C can be manufactured by depositing the layer 106*h* having a hole-transporting property or the layer 106*e* having an electron-transporting property in each predetermined position by a known method such as a vacuum vapor deposition method. This can be performed appropriately by those skilled in the art. Although it is preferable that a film thickness of the layer 106*h* having a hole-transporting property or the layer 106*e* having an electron-transporting property is 10 to 100 nm, there is no limitation on the film thickness.

Embodiment Mode 4

In this embodiment mode, a light-emitting device according to the present invention using the semiconductor element described in Embodiment mode 1 or 2 will be explained. Note that the light-emitting device according to the present invention includes in its category a panel where a pixel portion having a light-emitting element is formed, a module where a means for controlling a semiconductor element such as an IC is mounted on the panel, and a module exteriorly provided with a means for controlling a semiconductor element such as an IC.

Figure 14A:
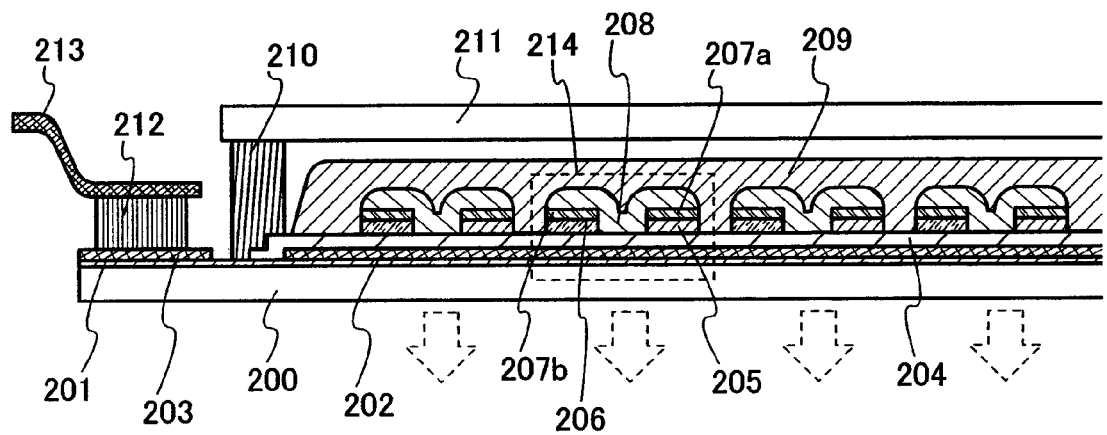
FIGS. 14A and 14B are each schematic cross-sectional and top views of a light-emitting device according to the present invention.
Figure 14B:
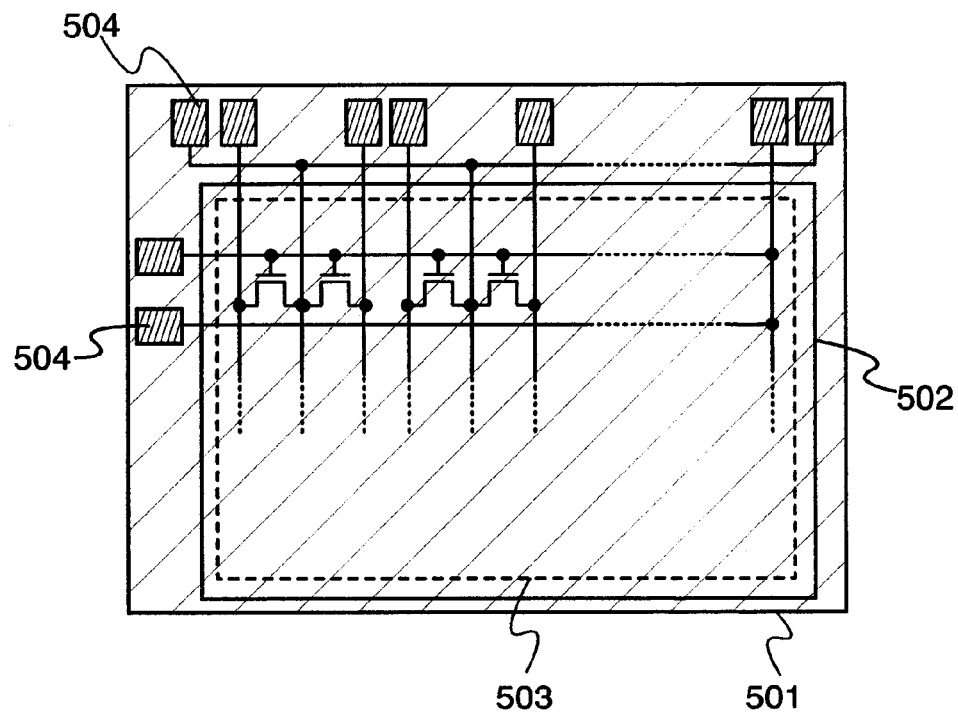

FIGS. 14A and 14B show an example of a cross-sectional view (A) and a top view (B) of a light-emitting device according to the present invention, respectively. The light-emitting devices shown in FIGS. 14A and 14B are each an extremely simple example of a light-emitting device according to the present invention, and a light-emitting device according to the present invention may have another structure other than this, of course. A light-emitting device according to the present invention is provided at least with a semiconductor element described in Embodiment Mode 1 or 2 and a means for controlling the semiconductor element.

In FIG. 14A, a base insulating film 201 is provided over a substrate 200, and a first electrode 202 and an external connection portion 203 are formed over the base insulating film 201. A first insulating film 204 is formed to cover the first electrode 202, and a second electrode including a layer 205 made of a second composite material and a conductive layer 207*a* and a third electrode including a layer 206 made of a first composite material and a conductive layer 207*b* are provided thereover. Further, a semiconductor layer 208 is formed by covering the second electrode, the third electrode, and therebetween, and thus, a semiconductor element 214 is formed.

The semiconductor element 214 may be protected by a second insulating film 209. A plurality of such semiconductor elements 214 is formed to form a display portion of a light-emitting device. A pixel portion where the semiconductor element 214 is formed is preferably protected from an external environment by being sealed by a sealing substrate 211 or the like with the use of a sealant 210. Inert gas may be filled or a drying agent may be provided in a space between the sealing substrate 211 and the insulating film 209.

The external connection portion 203 is electrically connected to a flexible printed circuit (FPC) 213 or the like by interposing an anisotropic conductive film 212 therebetween. A signal from a means for controlling the semiconductor element 214 (not shown) is inputted into the pixel portion through this FPC 213.

FIG. 14B is a schematic block diagram viewed from the top face of the light-emitting device. In the light-emitting device in this embodiment mode, an element substrate 501 where the semiconductor element is formed is sealed with a sealing substrate 502, and a pixel portion 503 formed in the element substrate 501 is sealed by the sealing substrate 502 and the sealant. A flexible printed circuit (FPC) is connected to an external connection portion 504 provided in a periphery of the pixel portion 503, and an external signal is inputted. Note that, as in this embodiment mode, a driver circuit and the flexible printed circuit may be provided independently or the both may be provided in combination like a TCP or the like where an IC chip is mounted on an FPC in which a wiring pattern is formed.

Note that a mode of a sealing structure and module of a light-emitting device is not limited thereto, of course, and it is possible to manufacture a light-emitting device by a known technique by following a technique regarding an organic EL panel.

A light-emitting device according to the present invention can be manufactured using a substrate that is extremely light like plastic but easily affected by heat; therefore, an extremely lightweight light-emitting device can be obtained. In addition, since plastic or the like is flexible, a flexible light-emitting device can be obtained. Moreover, a light-emitting device according to the present invention has high yields because there is a few manufacturing elements and can be manufactured inexpensively because of an advantage in reducing the cost.

Embodiment Mode 5

Figure 15A:
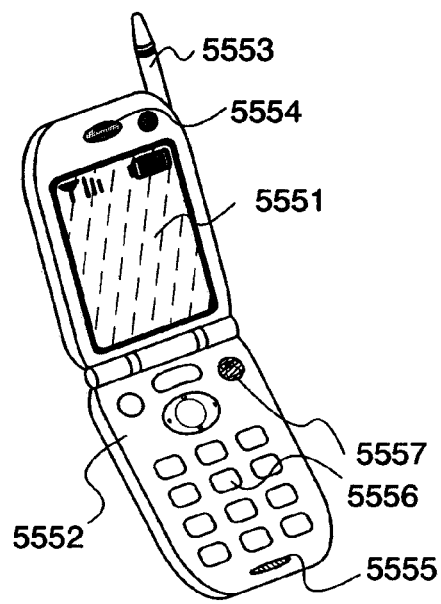
FIGS. 15A to 15C are views each showing an electronic device according to the present invention.
Figure 15B:
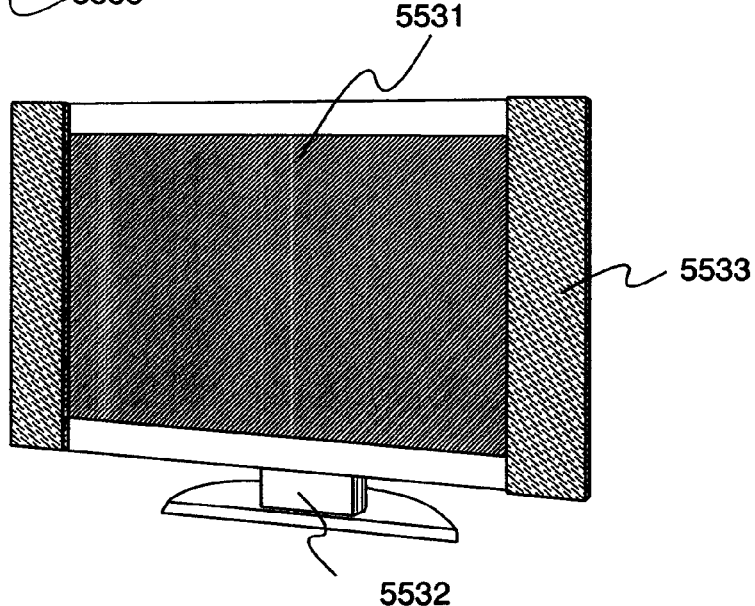
Figure 15C:
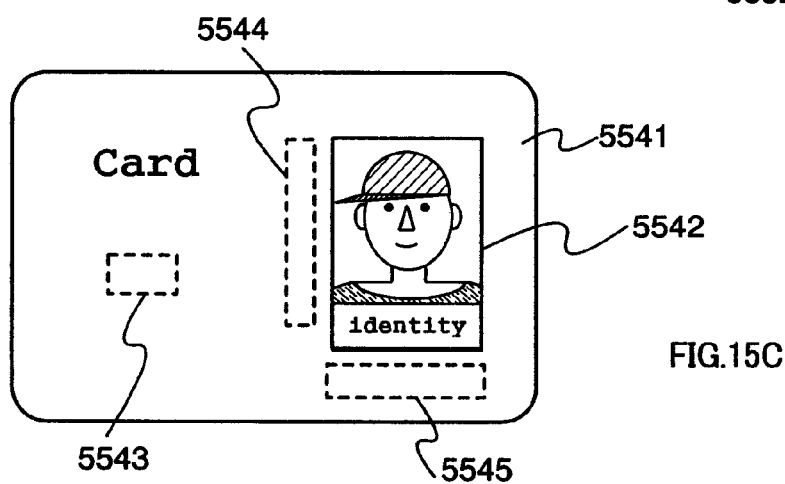

The light-emitting device shown in Embodiment Mode 4 can be mounted on a telephone handset, a television receiver, or the like as shown in FIGS. 15A, 15B, and 15C. In addition, the light-emitting device may be mounted on a card having a function of managing personal information like an ID card.

FIG. 15A shows a cellular phone handset according to the present invention, which includes a display portion 5551, an audio output portion 5554, an audio input portion 5555, operation switches 5556 and 5557, an antenna 5553, and the like in a main body 5552. The light-emitting device described in Embodiment Mode 4 is used for the display portion 5551. The display portion 5551 of this cellular phone handset is extremely light; therefore, a lightweight cellular phone handset can be obtained. In addition, the display portion 5551 can be manufactured inexpensively; therefore, a cellular phone handset superior in cost performance can be obtained.

FIG. 15B is a television receiver according to the present invention, which includes a display portion 5531, a housing 5532, speakers 5533, and the like. The light-emitting device described in Embodiment Mode 4 is used for the display portion 5531. The display portion 5531 of this television receiver is extremely light; therefore, a lightweight television receiver can be obtained. In addition, the display portion 5531 can be manufactured inexpensively; therefore, a television receiver superior in cost performance can be obtained.

FIG. 15C is an ID card according to the present invention, which includes a support body 5541, a display portion 5542, a integrated circuit chip 5543 incorporated into the support body 5541, and the like. The light-emitting device described in Embodiment Mode 4 is used for the display portion 5542. Note that integrated circuits 5544 and 5545 for driving the display portion 5542 are also incorporated into the support body 5541. This ID card is kept in an extremely lightweight and thin shape while having the display portion 5542. In addition, the display portion 5542 can be manufactured inexpensively; therefore, an ID card that can be manufactured inexpensively while having the display portion 5542 can be obtained. Moreover, in the display portion 5542, it is possible to display information that is inputted and outputted in the integrated circuit chip 5543 and to confirm what kind of information is inputted and outputted, for example.

Embodiment Mode 6

Figure 16:
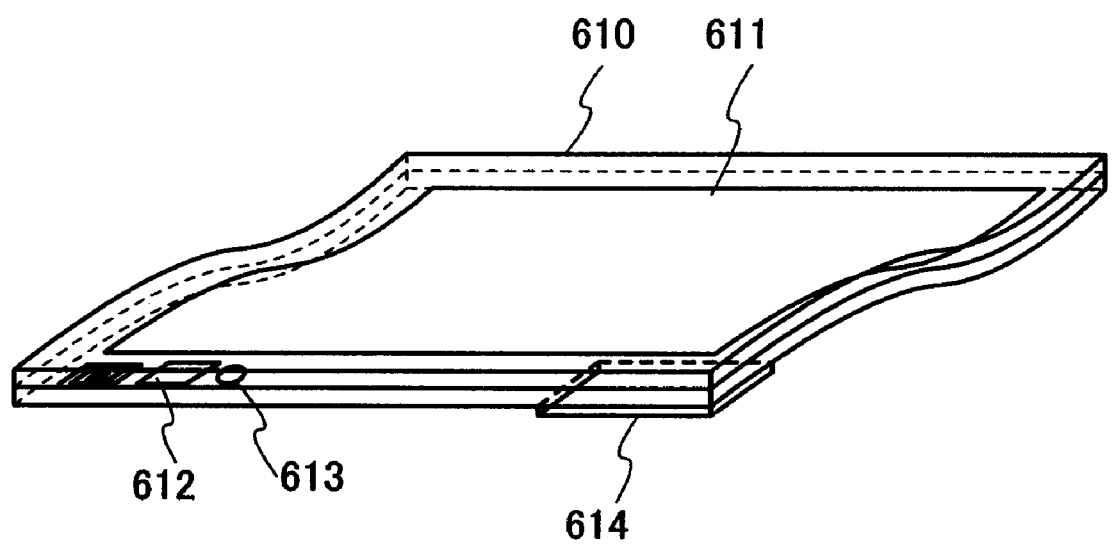
FIG. 16 is a view showing an electronic device according to the present invention.

As another embodiment mode according to the present invention, an example where the semiconductor element described in Embodiment Mode 1 or 2 is applied to a flexible light-emitting device will be shown with reference to FIG. 16.

A light-emitting device according to the present invention shown in FIG. 16 may be placed in a housing, and a main body 610, a pixel portion 611 for displaying an image, a driver IC 612, a receiver device 613, a film battery 614, and the like are included therein. The driver IC, the receiver device, or the like may be mounted using a semiconductor component. In a light-emitting device according to the present invention, a material for forming the main body 610 is formed of a flexible material such as plastic or a film. Although such a material is easily affected by heat in many cases, it becomes possible to manufacture a light-emitting device with a material that is easily affected by heat by forming a pixel portion with the use of the semiconductor element described in Embodiment Mode 1 or 2.

Such a light-emitting device is extremely light and flexible; therefore, the light-emitting device can also be rolled up into a cylinder, which is extremely advantageous in carrying. With the use of a light-emitting device according to the present invention, a display medium with a large-sized screen can be carried freely.

In addition, such a light-emitting device according to the present invention has a high aperture ratio. Moreover, there is a few manufacturing elements compared with a light-emitting device using an organic EL element; therefore, the light-emitting device has high yields. Further, the light-emitting device according to the present invention can be manufactured simply and easily. Furthermore, the light-emitting device according to the present invention has a low drive voltage and low power consumption.

Note that the light-emitting device shown in FIG. 16 can be used as means for mainly displaying a still image including an electrical home appliance such as a refrigerator; a washing machine; a rice cooker; a fixed telephone; a vacuum cleaner; and a clinical thermometer, a railroad wall banners, and a large-sized information display such as an arrival and departure guide plate in a railroad station and an airport, as well as a navigation system, an audio reproducing device (such as a car audio, an audio component, and the like), a personal computer, a game machine, and a portable information terminal (such as a mobile computer, a cellular phone, a portable game machine, an electronic book, and the like).

The present application is based on Japanese Patent Application serial No. 2005-125807 filed on Apr. 22, 2005 in Japanese Patent Office, the entire contents of which are hereby incorporated by reference.

What is claimed is:

1. A semiconductor element comprising:
a first electrode;
an insulating film over the first electrode;
a semiconductor layer containing an organic compound over and in contact with the insulating film;
a second electrode including at least partially a first layer containing a first composite material over the semiconductor layer; and
a third electrode including at least partially a second layer containing a second composite material over the semiconductor layer,
wherein the second composite material contains an organic compound having a hole-transporting property and a metal oxide,
wherein the first composite material contains an organic compound having an electron-transporting property and alkaline metal or alkaline earth metal, and
wherein the first layer and the second layer are each in contact with the semiconductor layer.

2. A semiconductor element according to claim 1, wherein the semiconductor layer emits light when voltage is applied between the second electrode and the third electrode.

3. A semiconductor element according to claim 1, wherein the semiconductor layer emits light when voltage is applied between the second electrode and the third electrode, and emission luminance is changed by changing voltage applied to the first electrode.

4. A semiconductor element according to claim 1, wherein the first electrode is a gate electrode, and the second electrode is a source electrode, and the third electrode is a drain electrode.

5. A semiconductor element comprising:
a first electrode;
an insulating film over the first electrode;
a semiconductor layer containing an organic compound over and in contact with the insulating film;
a second electrode including at least partially a first layer containing a first composite material over the semiconductor layer; and
a third electrode including at least partially a second layer containing a second composite material over the semiconductor layer,
wherein the second composite material contains an organic compound having a hole-transporting property and a metal oxide,
wherein the first composite material contains an organic compound having an electron-transporting property and alkaline metal or alkaline earth metal,
wherein the first layer and the second layer are each in contact with the semiconductor layer, and
wherein the second electrode is formed of two layers of the first layer and a first conductive layer, and the first conductive layer is not in contact with the semiconductor layer.

6. A semiconductor element according to claim 5, wherein length of a channel length direction of the first conductive layer is shorter than length of a channel length direction of the first layer made of the first composite material.

7. A semiconductor element according to claim 5, wherein the first conductive layer is covered with the first layer comprising the first composite material.

8. A semiconductor element according to claim 5, wherein the semiconductor layer emits light when voltage is applied between the second electrode and the third electrode.

9. A semiconductor element according to claim 5, wherein the semiconductor layer emits light when voltage is applied between the second electrode and the third electrode, and emission luminance is changed by changing voltage applied to the first electrode.

10. A semiconductor element according to claim 5, wherein the first electrode is a gate electrode, and the second electrode is a source electrode, and the third electrode is a drain electrode.

11. A semiconductor element comprising:
a first electrode;
an insulating film over the first electrode;
a semiconductor layer containing an organic compound over and in contact with the insulating film;
a second electrode including at least partially a first layer containing a first composite material over the semiconductor layer; and
a third electrode including at least partially a second layer containing a second composite material over the semiconductor layer,
wherein the second composite material contains an organic compound having a hole-transporting property and a metal oxide,
wherein the first composite material contains an organic compound having an electron-transporting property and alkaline metal or alkaline earth metal,
wherein the first layer and the second layer are each in contact with the semiconductor layer, and
wherein the third electrode is formed of two layers of the second layer and a second conductive layer, and the second conductive layer is not in contact with the semiconductor layer.

12. A semiconductor element according to claim 11, wherein length of a channel length direction of the second conductive layer is shorter than length of a channel length direction of the second layer comprising the second composite material.

13. A semiconductor element according to claim 11, wherein the second conductive layer is covered with the second layer comprising the second composite material.

14. A semiconductor element according to claim 11, wherein the semiconductor layer emits light when voltage is applied between the second electrode and the third electrode.

15. A semiconductor element according to claim 11, wherein the semiconductor layer emits light when voltage is applied between the second electrode and the third electrode, and emission luminance is changed by changing voltage applied to the first electrode.

16. A semiconductor element according to claim 11, wherein the first electrode is a gate electrode, and the second electrode is a source electrode, and the third electrode is a drain electrode.

* * * * *